(12) United States Patent
Shim et al.

(10) Patent No.: US 11,501,953 B2
(45) Date of Patent: Nov. 15, 2022

(54) PLASMA PROCESSING EQUIPMENT

(71) Applicant: SAMSUNG ELECTRONICS CO., LTD., Suwon-si (KR)

(72) Inventors: Seung Bo Shim, Seoul (KR); Doug Yong Sung, Seoul (KR); Young Jin Noh, Ansan-si (KR); Yong Woo Lee, Hwaseong-si (KR); Ji Soo Im, Seongnam-si (KR); Hyeong Mo Kang, Hwaseong-si (KR); Peter Byung H Han, Suwon-si (KR); Cheon Kyu Lee, Hwaseong-si (KR); Masato Horiguchi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 164 days.

(21) Appl. No.: 16/361,341

(22) Filed: Mar. 22, 2019

(65) Prior Publication Data
US 2019/0304754 A1 Oct. 3, 2019

(30) Foreign Application Priority Data

Mar. 28, 2018 (KR) .................. 10-2018-0035975
Jan. 4, 2019 (KR) .................. 10-2019-0001053

(51) Int. Cl.
*H01L 21/00* (2006.01)
*H01J 37/32* (2006.01)
*H01L 21/683* (2006.01)
*H03H 7/38* (2006.01)
*H03H 7/01* (2006.01)
*H01L 21/67* (2006.01)

(52) U.S. Cl.
CPC .. *H01J 37/32183* (2013.01); *H01J 37/32091* (2013.01); *H01J 37/32642* (2013.01); *H01J 37/32724* (2013.01); *H01L 21/67069* (2013.01); *H01L 21/6833* (2013.01); *H03H 7/0115* (2013.01); *H03H 7/38* (2013.01); *H01J 2237/002* (2013.01); *H01J 2237/3347* (2013.01)

(58) Field of Classification Search
CPC .................................................. Y10S 156/915
USPC ....................................................... 156/915
See application file for complete search history.

(56) References Cited

U.S. PATENT DOCUMENTS

| 6,475,336 | B1 | 11/2002 | Hubacek |
| 6,514,347 | B2 | 2/2003 | Denpoh |
| 7,288,166 | B2 | 10/2007 | Ohmoto et al. |

(Continued)

*Primary Examiner* — Sylvia MacArthur
*Assistant Examiner* — Michelle Crowell
(74) *Attorney, Agent, or Firm* — Volentine, Whitt & Francos, PLLC

(57) ABSTRACT

Plasma processing equipment includes a chuck stage for supporting a wafer and including a lower electrode, an upper electrode disposed on the chuck stage, an AC power supply which applies first to third signals having different magnitudes of frequencies to the upper electrode or the lower electrode, a dielectric ring which surrounds the chuck stage, an edge electrode located within the dielectric ring, and a resonance circuit connected to the edge electrode. The resonance circuit includes a filter circuit which allows only the third signal among the first to third signals to pass, and a series resonance circuit connected in series with the filter circuit and having a first coil and a first variable capacitor connected in series and grounded.

16 Claims, 22 Drawing Sheets

(56) References Cited

U.S. PATENT DOCUMENTS

| | | | |
|---|---|---|---|
| 7,415,940 B2* | 8/2008 | Koshimizu | H01J 37/32082 118/723 E |
| 7,829,469 B2 | 11/2010 | Chen et al. | |
| 8,894,806 B2 | 11/2014 | Koshimizu et al. | |
| 8,920,611 B2* | 12/2014 | Forster | H01J 37/3444 204/192.12 |
| 9,196,512 B2* | 11/2015 | Kobayashi | H01L 21/67103 |
| 9,412,579 B2 | 8/2016 | Sadjadi et al. | |
| 9,852,889 B1 | 12/2017 | Kellogg et al. | |
| 2001/0022293 A1* | 9/2001 | Maeda | H01J 37/32697 216/67 |
| 2002/0023716 A1* | 2/2002 | Ohmoto | H01J 37/32706 156/345.12 |
| 2004/0149221 A1* | 8/2004 | Koshimizu | H01J 37/32174 118/723 R |
| 2004/0173318 A1* | 9/2004 | Chou | H01L 21/6833 156/345.51 |
| 2006/0196605 A1 | 9/2006 | Ikegami et al. | |
| 2008/0006207 A1* | 1/2008 | Miyagawa | H01J 37/32623 118/724 |
| 2008/0073032 A1 | 3/2008 | Koshiishi et al. | |
| 2008/0178803 A1* | 7/2008 | Collins | H01J 37/32165 118/708 |
| 2008/0236746 A1* | 10/2008 | Oyabu | H01J 37/32623 156/345.23 |
| 2009/0000744 A1* | 1/2009 | Dhindsa | H01J 37/32091 156/345.51 |
| 2009/0071938 A1* | 3/2009 | Dhindsa | H01J 37/32568 216/67 |
| 2010/0252199 A1* | 10/2010 | Marakhtanov | H01J 37/32165 156/345.48 |
| 2013/0228550 A1* | 9/2013 | Mori | H01L 21/3065 216/61 |
| 2013/0260567 A1* | 10/2013 | Marakhtanov | H01J 37/32165 438/710 |
| 2014/0034243 A1 | 2/2014 | Dhindsa et al. | |
| 2014/0373782 A1 | 12/2014 | Park et al. | |
| 2015/0024515 A1* | 1/2015 | Hoffman | H01J 37/32706 438/5 |
| 2016/0351404 A1* | 12/2016 | Aramaki | H01J 37/32715 |
| 2017/0018411 A1 | 1/2017 | Sriraman et al. | |
| 2017/0186590 A1* | 6/2017 | Wu | H01L 21/67103 |
| 2017/0213753 A1 | 7/2017 | Rogers | |
| 2018/0025891 A1* | 1/2018 | Marakhtanov | H01J 37/3299 438/714 |
| 2018/0102238 A1* | 4/2018 | Gu | H01J 37/32183 |
| 2018/0366304 A1* | 12/2018 | Shim | H01L 21/67069 |

* cited by examiner

PLASMA PROCESSING EQUIPMENT

PRIORITY STATEMENT

This application claims priority to Korean Patent Application No. 10-2018-0035975 filed on Mar. 28, 2018, and to Korean Patent Application No. 10-2019-0001053 filed on Jan. 4, 2019, and all the benefits accruing therefrom under 35 U.S.C. § 119, the disclosures of which are hereby incorporated by reference in their entirety.

BACKGROUND

1. Field

The present inventive concepts relates to plasma processing equipment.

2. Description of the Related Art

Nowadays the manufacturing of semiconductor devices and the like typically includes the etching of a substrate (e.g., a wafer) using a plasma to form features in the substrate. For example, such plasma etching has been recently adapted to from openings in which high aspect ratio contacts (HARCs) can be provided, high aspect ratio referring to a relatively large ratio of height to width. Increased plasma control is required for etching a substrate to form the openings required for high aspect ratio contacts (HARC) and the like. In particular, the ion energy of the plasma and the etch rate of the plasma should be great. The lowering of a bias frequency and increasing of an RF radio frequency power in plasma processing equipment has been considered to these ends.

However, as the desired aspect ratio becomes greater, the effects of lowering the frequency and increasing the RF power are slowed due to an increase in the loading effect.

To solve this problem the RF power may be pulsed in an attempt to effect a charging mitigation action. As a result, the loading effect, and the etch rate and the profile of the openings have been improved to some extent. However, the charging effect is enhanced in accordance with the increase in the bias voltage due to the increase in the RF power. Thus, this method may be limited to the extent in which it can provide control of the plasma necessary for efficiently and precisely forming features such as high aspect ratio openings specified by current design rules.

The etch rate may also be determined by controlling the sheath. The sheath refers to a space between the plasma and the wafer, and an incident angle of the plasma may be determined via control of the sheath. The etching direction and the etch rate can be determined depending on the incident angle of the plasma.

There are two major methods for controlling the sheath. First, there is a method for controlling the sheath by controlling the plasma shape at the plasma generation stage, and second, there is a method for controlling the sheath by adjusting electric field intensity.

SUMMARY

According to some aspects of the present inventive concepts, there is provided plasma processing equipment comprising a chuck stage having an upper surface dedicated to support a substrate thereon, and including a lower electrode, an upper electrode disposed over the chuck stage, an AC power supply configured to produce a first signal, a second signal and a third signal of respective frequencies different from each other and operatively connected to the upper electrode or the lower electrode, a dielectric ring extending around the chuck stage. An edge electrode disposed within the dielectric ring, and a resonance circuit connected to the edge electrode. The resonance circuit includes a filter circuit which allows only the third signal among the first, second and third signals to pass from the filter circuit, and a series resonance circuit connected in series with the filter circuit and having a coil and a grounded variable capacitor connected in series to the coil.

According to some aspects of the present inventive concepts, there is also provided plasma processing equipment comprising a process chamber, a substrate support disposed inside the process chamber, the substrate support having an upper surface dedicated to support a substrate thereon, a lower electrode integral with the substrate support, an upper electrode disposed in an upper part of the process chamber above the upper surface of the substrate support and constituting a plasma source with the lower electrode, an AC power supply connected to one of said lower and upper electrodes and configured to generate signals at a plurality of different frequencies, edge ring structure circumjacent the upper surface of the substrate support, a dielectric ring on which the edge ring structure is disposed, an edge electrode disposed within the dielectric ring with the dielectric ring interposed between the edge electrode and the edge ring structure, and a resonance circuit disposed outside the process chamber and electrically connected to the edge electrode. The resonance circuit includes a filter circuit that selectively allows signals of one of said frequencies to be transmitted in the resonance circuit, and a series resonance circuit connected in series with the filter circuit and having a coil and a grounded variable capacitor connected in series with the coil.

According to some aspects of the present inventive concepts, there is also provided plasma processing equipment comprising a chuck stage having an upper surface dedicated to support a substrate thereon, and including a lower electrode, a gas feeder that supplies gas toward the chuck stage, the gas feeder including an upper electrode disposed above the upper surface the chuck stage and constituting a plasma source with the lower electrode, an AC power supply configured to produce a first signal, a second signal and a third signal of respective frequencies different from each other and operatively connected to the upper electrode or the lower electrode, a dielectric ring extending around a lower part of the chuck stage, edge ring structure disposed on the dielectric ring and extending around an upper part of the chuck stage, an edge electrode within the dielectric ring, and a resonance circuit electrically connected to the edge electrode. The resonance circuit includes a filter circuit which that selectively allows only the third signal among the first, second and third signals to pass, and a series resonance circuit connected in series with the filter circuit and having a first coil and a grounded first variable capacitor connected in series with the first coil.

According to some aspects of the present inventive concepts, there is also provided plasma processing equipment comprising a chuck stage having an upper surface having an upper surface dedicated to support a substrate thereon, a lower electrode disposed under the chuck stage, an upper electrode disposed over the chuck stage, an AC power supply configured to produce a first signal, a second signal and a third signal of respective frequencies different from each other and operatively connected to the upper electrode or the lower electrode, a dielectric ring extending around the chuck stage, an edge electrode located inside the dielectric ring, a resonance circuit connected to the edge electrode and configured to selectively allow only the third signal among the first, second and third signals to pass, and a cooling line containing refrigerant thermally coupled to the dielectric ring and the edge electrode.

BRIEF DESCRIPTION OF THE DRAWINGS

The above and other aspects and features of the present inventive concepts will become more apparent from the detailed description of examples thereof that follows with reference to the attached drawings, in which.

DETAILED DESCRIPTION

Figure 1:
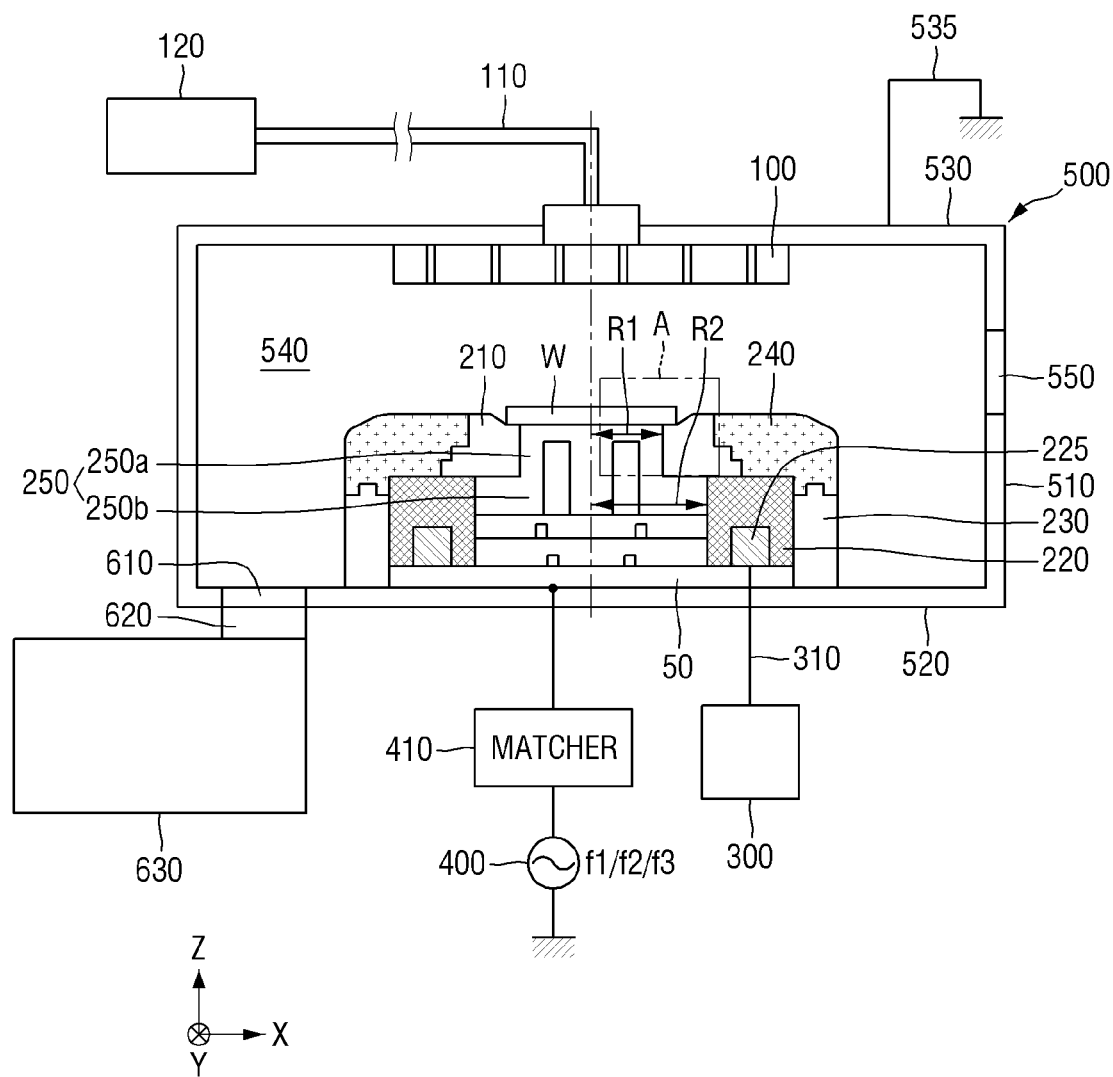
FIG. 1 is a schematic diagram of an example of plasma processing equipment according to the present inventive concepts.

Hereinafter, examples of plasma processing equipment according to the present inventive concepts will be described with reference to the drawings. In the drawings, like or similar reference numbers designate like or similar elements and features of the plasma processing equipment. Different versions of similar elements or features may be differentiated through the use of reference letters following like reference numbers.

One example of plasma processing equipment according to the present inventive concepts will be described with reference to FIGS. 1 to 8.

Referring to FIG. 1, the plasma processing equipment includes a chamber 500, a base 50, a chuck stage 250 (e.g., an electrostatic chuck (ESC)), a gas feeder 100 (e.g., a showerhead), an AC power supply 400, a matcher 410, a dielectric ring 220, edge ring structure which may also be referred to as a focus ring including a first edge ring 210 and a second edge ring 240, an outer wall 230, an edge electrode 225, and a resonance circuit 300.

The chamber 500 may serve as a housing that contains other components. To this end, the chamber 500 includes, i.e., delimits, a cavity 540. The chuck stage 250, gas feeder 100 and dielectric ring 220 may be disposed in the cavity 540.

The chamber 500 may define an isolated (from the atmosphere) processing space in which the plasma process is performed on a wafer W. As the chamber 500 is isolated from the outside, the process conditions of the plasma process may be adjusted. Specifically, process conditions such as temperature or pressure inside the chamber may be regulated to be different from those outside the chamber.

The chamber 500 may include a chamber bottom 520, a chamber side wall 510, a chamber ceiling 530 and the like. The cavity 540 may be defined by the chamber bottom 520, the chamber side wall 510, and the chamber ceiling 530. That is, the cavity 540 may be surrounded by the chamber bottom 520, the chamber side wall 510, and the chamber ceiling 530.

The chamber bottom 520 may comprise the bottom surface of the chamber 500. The chamber bottom 520 may support a chuck stage 250 or the like located inside the chamber 500. The chamber bottom 520 may include a discharge port 610. The discharge port 610 may be a hole through which gas used for plasma inside the chamber is discharged.

The chamber side wall 510 may comprise the side surface of the chamber 500. The chamber side wall 510 may have various shapes as viewed from a third direction Z, i.e., may have various cross-sectional shapes. For example, the chamber side wall 510 may be circular, elliptical, square, or otherwise polygonal. However, the cross-sectional shape of the chamber side wall 510 is not limited thereto but may be of any shape as long as it is able to isolate the cavity 540 from the outside environment.

The chamber side wall 510 may include an opening 550. The opening 550 may be a port through which the wafer W may enter and exit. That is, the wafer W is moved to the inside of the chamber 500 through the opening 550 from the outside, and is moved to the outside of the chamber 500 through the opening 550 after the plasma process is completed whereupon a subsequent processes may be performed Although only one opening 550 is illustrated in FIG. 1, the present inventive concepts is not limited thereto. That is, in some examples of the present inventive concepts, a plurality of openings 550 may exist. In such a case, the opening 550 used for the entry and exist of the wafer W may be freely selected depending on the order of the process and the position of the device.

The opening 550 may be closed when the discharge port 610 for discharging the gas used for plasma is opened and the vacuum module 630 operates. This is because all the passages other than the discharge port 610 should be closed to discharge the gas used for the plasma.

The base 50 may be fixed on the chamber bottom 520 of the chamber 500. The base 50 may support the chuck stage 250. The plasma processing equipment may include the chuck stage 250 without the base 50. That is, the base 50 is not an essential component.

The chuck stage 250 supports the wafer W. The chuck stage 250 may be fixed to the base 50. The chuck stage 250 may have, but is not limited to, a circular planar upper (support) surface dedicated to support the wafer W especially when the wafer W is generally circular. However, the shape of the upper surface of the chuck stage 250 may depend on and correspond to the shape of the wafer W or may depend on other factors.

The chuck stage 250 may be movable in at least one of a first direction X, a second direction Y, and a third direction Z. Accordingly, the chuck stage 250 may adjust the processing position of the wafer W. That is, the chuck stage 250 may be movable independently along three orthogonal axes to adjust the position of the wafer W relative to the processing space. To this end, one or more driving mechanisms (not shown but well known per se) may be connected to the chuck stage 250, such as an elevating mechanism for a raising and lower the chuck stage 250 and/or motors for translating the chuck stage independently in the X and Y directions.

The gas feeder 100 may be fixed to the chamber ceiling 530 of the chamber 500. The gas feeder 100 may be located over the chuck stage 250. The gas feeder 100 may supply gas toward the upper surface of the wafer W seated on the upper surface of the chuck stage 250.

The plasma process may include the dry etching of the upper surface of the wafer W using plasma produced from a source gas. The gas used for producing the plasma may be supplied to the inside of the chamber 500 by the gas feeder 100.

The gas supply line 110 may be connected to the gas feeder 100. The gas supply line 110 is connected to the chamber ceiling 530 and may be connected to the gas feeder 100 from the outside. The gas supply line 110 may be connected to the gas source 120 from the outside and may supply the source gas used for producing the plasma to the interior of the chamber 500. The location of the gas supply line 110 may vary, depending on the structure and the position of the chamber 500 and the position of the gas source 120.

The gas source 120 stores the gas used for generating plasma, and thus may provide the gas used for plasma to the chamber 500 at the time of the plasma process. In the drawings, the gas source 120 is illustrated as supplying gas through the gas supply line 110 from the outside of the chamber 500. However, in plasma processing equipment according to the present inventive concepts, the gas source 120 may be directly attached to the chamber 500.

The gas feeder 100 may have a plurality of nozzles to supply the gas used for generating the plasma to the interior of the chamber 500. However, the inventive concepts are not limited thereto.

The gas feeder 100 may include a gas manifold (body) or the like and an upper electrode integral with the manifold for a plasma process. Alternatively, the gas feeder 100 may directly serve as an upper electrode. In either case, the gas feeder 100 may be considered as including an upper electrode. A lower electrode for the plasma process may be integral with a body constituted by the chuck stage 250 and the base 50 and which body has the upper surface dedicated to support the substrate, e.g., wafer, to be etched with the plasma. Or the chuck stage 250 having the upper surface dedicated to support the substrate and the base 50 may directly serve as the lower electrode (in which case the base may be considered as part of the chuck stage 250). That is, the chuck stage 250 may be considered in either case to include the lower electrode. The upper electrode and the lower electrode may face each other and constitute a capacitive plasma source for the forming of a plasma in the chamber 500.

The chuck stage 250 and the base 50 may be connected to the matcher 410 and the AC power supply 400. The gas feeder 100 may be grounded through a second line 535. Alternatively, the AC power supply 400 may be connected to the upper electrode of the plasma source.

The AC power supply 400 may provide a bias voltage and an RF signal for the plasma process. Through this, the plasma may be created in the chamber 500 and directed toward the upper surface of the wafer W by an electric field formed by the bias voltage. Because the plasma contains ionized particles, the plasma can be directed in a desired direction (i.e., a vertical direction in this example) by the formation of an electric field.

Specifically, the AC power supply 400 may produce signals having three different frequencies and transmit the signals to the base 50 and the chuck stage 250. That is, the AC power supply 400 may transmit the first to third signals having the first to third frequencies f1 to f3 to the base 50 and the chuck stage 250. At this time, the first frequency f1 may be greater than the second frequency f2, and the second frequency f2 may be greater than the third frequency f3. That is, the third frequency f3 may be smaller than the first frequency f1 and the second frequency f2.

At this time, the first frequency f1 may be greater than 10 MHz and less than 200 MHz, and the second frequency f2 may be greater than 1 MHz and less than 10 MHz. The third frequency f3 may be greater than 0 and less than 1 MHz. However, the present inventive concepts are not limited to these examples.

The first signal of the first frequency f1 and the second signal of the second frequency f2 may be signals for forming the plasma by exciting the plasma source gas supplied by the gas feeder 100. On the contrary, the third signal of the third frequency f3 may be for executing the actual plasma process, and plasma may execute etching on the upper surface of the wafer W in the vertical direction in accordance with the third signal of the third frequency f3.

The matcher 410 may be connected to the AC power supply 400. The matcher 410 may be located between the AC power supply 400 and the base 50. The matcher 410 may selectively transmit the first to third frequencies f1 to f3 to the base 50 using a plurality of capacitors, i.e., may transmit any one of the signals while blocking the rest of the signal(s). For example, in order to transmit the first signal of the first frequency f1 to the base 50, the matcher 410 blocks the second signal of the second frequency f2 and the third signal of the third frequency f3 thereby allowing only the first signal of the first frequency f1 to pass.

The discharge port 610 may be located on one side of the chamber 500. In the drawing, the discharge port 610 is formed in the chamber bottom 520 of the chamber 500, but it is not limited thereto. The discharge port 610 may be formed in the chamber bottom 520, the chamber side wall 510 or the chamber ceiling 530 of the chamber 500.

The discharge port 610 may be a hole through which the gas used for plasma is discharged when the plasma process is completed. While the gas used for plasma is discharged through the discharge port 610, the opening 550 through which the wafer W enters and exits may be closed.

The discharge port 610 may be connected to an intake port 620. The intake port 620 may be a passage through which gas used for plasma discharged by the discharge port 610 moves to the vacuum module 630. The intake port 620 may be connected to the vacuum module 630. In the plasma processing equipment according to the present inventive concepts, the suction port is omitted, and the vacuum module 630 and the discharge port 610 may be in contact with each other.

The vacuum module 630 may draw gas used for plasma in the chamber 500. The vacuum module 630 may provide vacuum pressure to the interior of the sealed chamber 500 to remove gas used for plasma in the chamber 500. The discharge port 610 may be closed to isolate the intake port 620 and the chamber 500 once the vacuum module 630 has evacuated the gas used for all the plasma.

The dielectric ring 220 may be located on the side surface of the chuck stage 250. The dielectric ring 220 may surround the side surface of the chuck stage 250. The dielectric ring 220 may surround the lower part 250b of the chuck stage 250. A first edge ring 210 and a second edge ring 240 which surround the upper part 250a of the chuck stage 250 may be located on the dielectric ring 220.

The first edge ring 210 may also be adjacent to the side surface of the wafer W. The first edge ring 210 may include a dielectric or a conductor. The first edge ring 210 may be disposed to prevent detachment of the wafer W and to adjust the electric potential for determining the location at which the plasma is incident.

The second edge ring 240 may surround the outer edge of the first edge ring 210. The second edge ring 240 may surround the upper part 250a of the chuck stage 250 like the first edge ring 210. That is, the upper part 250a of the chuck stage 250, the first edge ring 210 and the second edge ring 240 may be sequentially arranged in the foregoing order a radially outward direction. The second edge ring 240 may also include a dielectric or a conductor.

The second edge ring 240 may be of, but is not limited to, the same material as the first edge ring 210. In plasma processing equipment according to the present inventive concepts, the first edge ring 210 and the second edge ring 240 may be of different materials.

For example, the first edge ring 210 and the second edge ring 240 may each be of a conductor like aluminum. Alternatively, the first edge ring 210 and the second edge ring 240 may each include at least one of Si, $SiO_2$, SiC, $Al_2O_3$, $ZrO_2$, PETE (polyethylene terephthalate), PEEK (PolyEtherther Ketone) and AlN. However, the present inventive concepts is not limited to these examples.

The outer wall 230 may surround the chuck stage 250, the base 50, the dielectric ring 220, the first edge ring 210 and the second edge ring 240. The outer wall 230 allows the chuck stage 250, the base 50, the dielectric ring 220, the first edge ring 210 and the second edge ring 240 to be isolated from the outside.

The second edge ring 240 may cover the top of the outer wall 230. The outer wall 230 surrounds the outer surface of the dielectric ring 220, and the upper surface thereof may be covered with the second edge ring 240.

However, the configuration of the outer wall 230 is not limited to that described above. Plasma processing equipment according to the present inventive concepts may include an outer wall 230 of any configuration and arrangement as long as it contains and all of the relevant internal components and isolates them from the outside.

Figure 2:
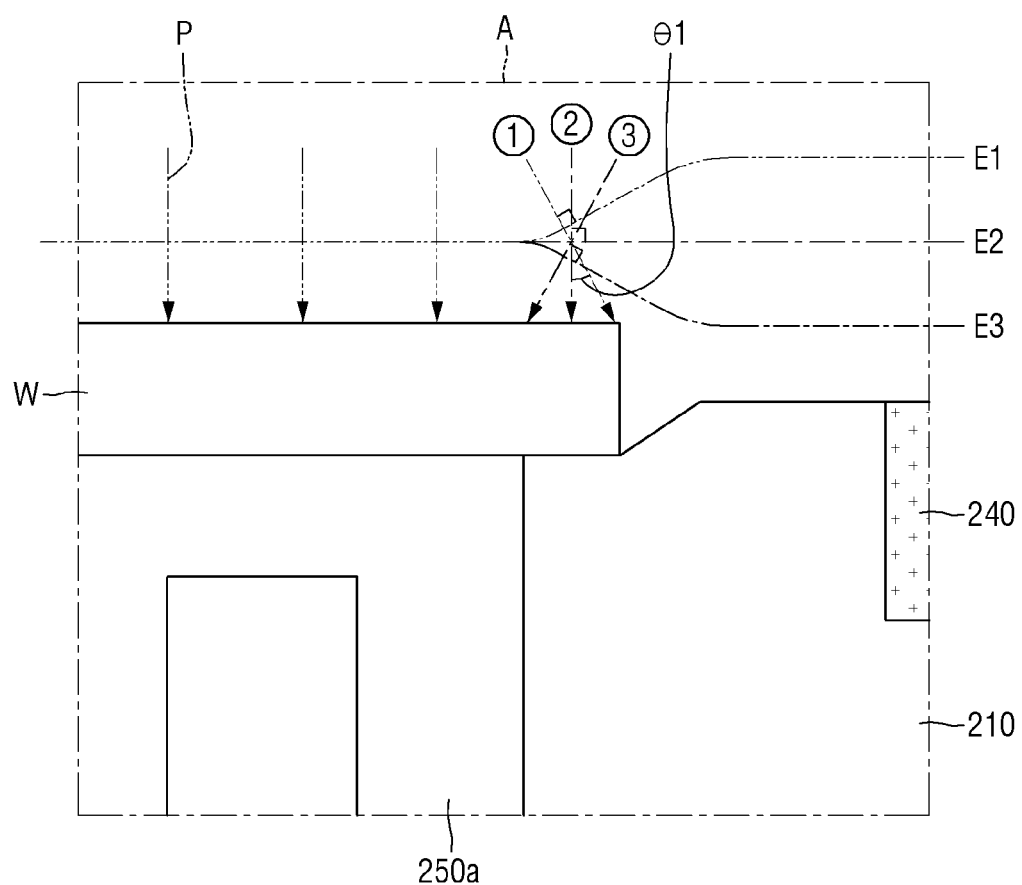
FIG. 2 is a conceptual diagram illustrating an incident direction of plasma in a part A in the plasma processing equipment of FIG. 1.
Figure 3:
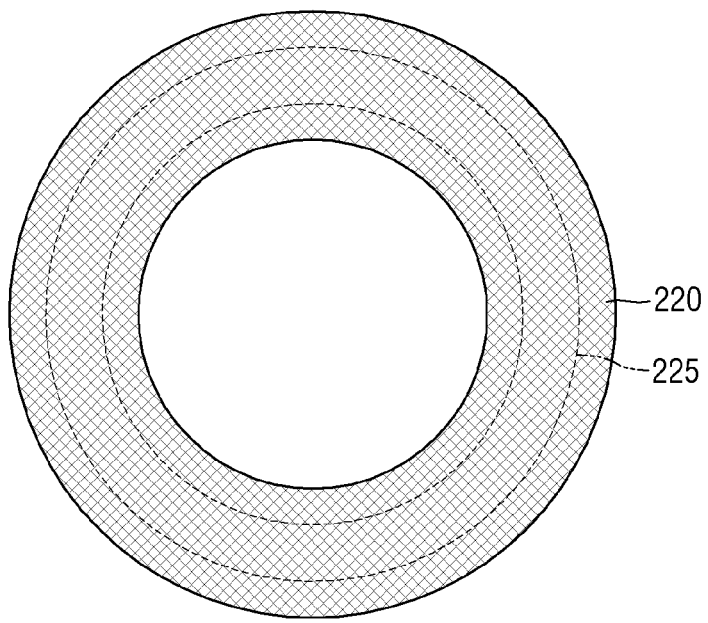
FIG. 3 is a plan view of a dielectric ring and an edge electrode of the plasma processing equipment of FIG. 1.
Figure 3:
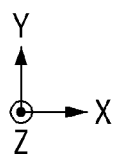

The incident direction of plasma in part A of the plasma processing equipment shown in FIG. 1 will be explained with reference to FIG. 2. Specifically, the angle of incidence of the plasma on the edge portion of the wafer W will be described.

Basically, the plasma P is vertically incident on the upper surface of the wafer W. This is because the electric potential formed on the wafer W is flat. Here, the equipotential surface may be represented as E1, E2 and E3 in FIG. 2.

These electric potentials may be kept flat at the center portion of the wafer W, but may not be flat at the edge portion of the wafer W. That is, the electric potential may be bent in accordance with the shape, thickness, material, etc. of the first edge ring 210 and the second edge ring 240. For this reason, when the electric potential is formed at a relatively high position at the edge portion like that represented by E1, the direction in which (ions of) the plasma P propagates is inclined toward the outside of the wafer due to the increased electric potential as illustrated by ①.

If the electric potential is kept flat at the edge portion of the wafer W like that represented by E2, the plasma P may be incident on the upper surface of the wafer in a direction perpendicular to the upper surface of the wafer W as illustrated by ②.

Conversely, for an electric potential at a relatively low position at the edge portion of the wafer W like that represented by E3, the plasma P is caused to propagate in a direction inclined inwardly toward the wafer W3 as illustrate by ③.

The first edge ring 210 and the second edge ring 240 may be worn as the plasma process is repeatedly performed, whereby thicknesses of the rings are reduced and the rings are otherwise deformed. As a result, the incident angle of the plasma P may gradually change in a sequence of ① and ② to ③.

When the incident angle of the plasma P increases, the variation in the etch rate of the wafer W becomes uneven depending on the position of the upper surface of the wafer W. Accordingly, the reliability and performance of the semiconductor device formed on the wafer may be lowered.

Because of such deformation, there is a need to periodically replace the first edge ring 210 and the second edge ring 240 with new ones in the existing plasma processing equipment. Also, in order to prolong the life expectancy of the first edge ring 210 and the second edge ring 240, the basic electric potential is matched to be like that represented by E1 rather than E2 in the figure such that the direction of propagation of the plasma P is inclined outward. However, once the direction of propagation of the plasma P is inclined in a direction from the edge portion toward the center of the wafer W as shown at ③, and the incident angle of the plasma P reaches a threshold, the first edge ring 210 and the second edge ring 240 are replaced.

The incident angle of plasma P at the edge portion of the wafer W continuously but minutely varies as the plasma process is repeatedly executed. Therefore, reliability of the process may vary and uniformity of the semiconductor devices produced using the plasma process is low.

In contrast, plasma processing equipment according to the present inventive concepts includes the edge electrode 225 capable of adjusting the electric potential of the edge area in real time. Therefore, it is possible to keep the incident angle of the plasma P at the edge portion of the wafer W uniform even over the course several executions of the plasma process.

Figure 4:
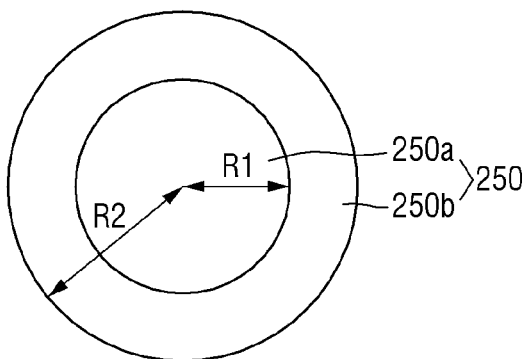
FIG. 4 is a plan view of a chuck stage of the plasma processing equipment of FIG. 1.
Figure 4:
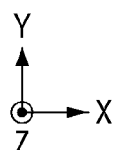

Referring to FIG. 4, the chuck stage 250 includes an upper part 250a (substrate support) and a lower part 250b. The upper part 250a may have a circular cross section with a first radius R1 and include the upper surface of the same shape (circular) that supports the substrate, e.g. the wafer W, during processing. The lower part 250b is connected to the bottom of the upper part 250a and may have a circular cross section with a second radius R2 larger than the first radius R1. That is, the chuck stage 250 may have a shape in which the upper part 250a protrudes upward from the lower part 250b.

In the drawings, both the upper part 250a and the lower part 250b of the chuck stage 250 have a circular cross section, but are not limited thereto. The shape of the chuck stage 250 is not limited as long as the lower part 250b has a larger area including the upper part 250a. That is, the chuck stage 250 may have any shape as long as the upper part 250a protrudes from the upper surface of the lower part 250b.

Referring to FIGS. 1 to 4, the dielectric ring 220 may be located below the first edge ring 210 and the second edge ring 240. The dielectric ring 220 may surround the lower part 250b of the chuck stage 250 on the base 50. The lower part of the dielectric ring 220 may be in contact with the upper surface of the base 50. The dielectric ring 220 may include at least one of Si, $SiO_2$, SiC, $Al_2O_3$, $ZrO_2$, PETE, PEEK and AlN. However, the present inventive concepts is not limited to these examples of dielectric material for the dielectric ring 220.

An edge electrode 225 comprising a conductor may be located in the dielectric ring 220. For example, the dielectric ring 200 may cover an upper surface and radially inner and outer peripheral surfaces of the edge electrode 225.

The edge electrode 225 and the dielectric ring 220 may surround the side surface of the chuck stage 250. The edge electrode 225 may be space from the chuck stage 250. In particular, the edge electrode 225 may be spaced apart from the chuck stage 250 by a part of the dielectric ring 220.

However, the edge electrode 225 may be coupled to the chuck stage 250 and the lower electrode of the base 50 to adjust the electric potential of the edge region of the wafer. This will be explained below in more detail.

The resonance circuit 300 may be electrically connected to the edge electrode 225. The resonance circuit 300 may be electrically connected to the edge electrode 225 through the control line 310. The control line 310 may connect the edge electrode 225 and the resonance circuit 300 through the base 50 and the chamber 500.

The resonance circuit 300 may be located outside the chamber 500. The resonance circuit 300 may be connected to the edge electrode 225 to adjust the electric potential of the edge region of the wafer W.

Figure 5:
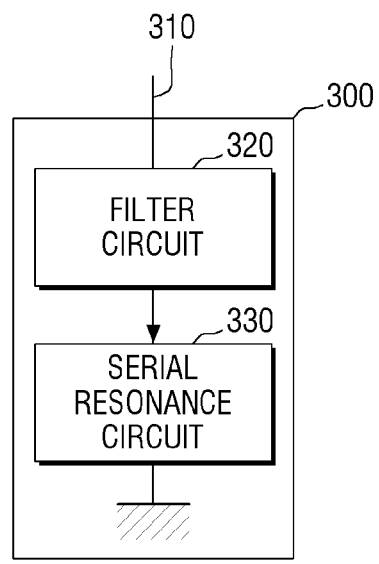
FIG. 5 is a block diagram of a resonance circuit of the plasma processing equipment of FIG. 1 in detail.

FIG. 5 is a block diagram of the resonance circuit.

Referring to FIG. 5, the resonance circuit 300 may include a first filter circuit 320 and a series resonance circuit 330.

The first filter circuit 320 may be connected to the control line 310. The first filter circuit 320 may allow only the third signal of the third frequency f3 to pass, among the first signal of the first frequency f1, the second signal of the second frequency f2 and the third signal of the third frequency f3. As a result, only the third signal of the third frequency f3 may be input to the series resonance circuit 330.

The series resonance circuit 330 may receive the third signal of the third frequency f3. The series resonance circuit 330 may be connected in series with the first filter circuit 320. The series resonance circuit 330 may be grounded.

Figure 6:
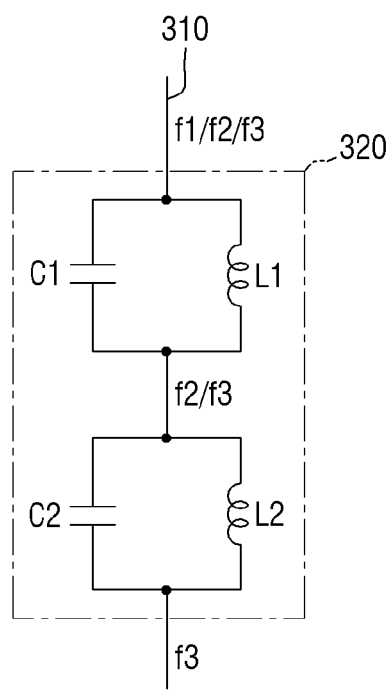
FIG. 6 is an equivalent circuit diagram of the filter circuit of FIG. 5.

FIG. 6 is an equivalent circuit diagram of the first filter circuit 320.

Referring to FIG. 6, the first filter circuit 320 may include a first parallel resonance circuit including a first capacitor C1 and a first coil L1 (i.e., a first "inductor"), and a second parallel resonance circuit including a second capacitor C2 and a second coil L2. The first and second parallel resonance circuits may be connected in series to each other.

The first parallel resonance circuit may be a circuit in which the first capacitor C1 and the first coil L1 are connected in parallel to each other. The first parallel resonance circuit may be a circuit which filters out the first signal of the first frequency f1.

The second parallel resonance circuit may be a circuit in which the second capacitor C2 and the second coil L2 are connected in parallel to each other. The second parallel resonance circuit may be a circuit which filters out the second signal of the second frequency f2.

The first filter circuit 320 may be a band rejection filter or a notch filter which allows the third signal of the third frequency f3 to pass and selectively blocks the first signal of the first frequency f1 and the second signal of the second frequency f2. This prevents the resonance circuit 300 from operating at the first signal of the first frequency f1 and the second signal of the second frequency f2 for generating the plasma, while causing the resonance circuit 300 to operate only at the third signal of the third frequency f3 at which the plasma is incident on the wafer W for etching.

Figure 7:
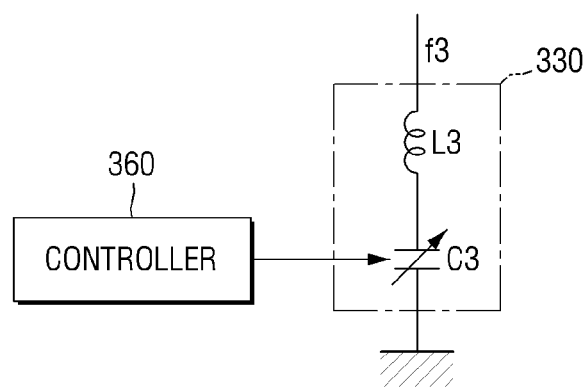
FIG. 7 is an equivalent circuit diagram of the series resonance circuit of FIG. 5.

FIG. 7 is an equivalent circuit diagram of the series resonance circuit 330.

Referring to FIGS. 1 and 7, the series resonance circuit 330 may include a third coil L3 and a third capacitor C3. The third coil L3 and the third capacitor C3 may be connected in series to each other. The third coil L3 and the second capacitor C3 may be grounded. That is, a separate AC power supply may not exist inside the resonance circuit 300.

The series resonance circuit 330 may receive the third signal of the third frequency f3. Accordingly, by providing impedance in which the third coil L3 and the third capacitor C3 are matched, the electric potential of the edge region of the wafer W may be controlled.

The third capacitor C3 is a variable capacitor and may be controlled by the controller 360. The controller 360 may adjust the electric potential of the edge region of the wafer W by controlling the value of the capacitance of the third capacitor C3.

Figure 8:
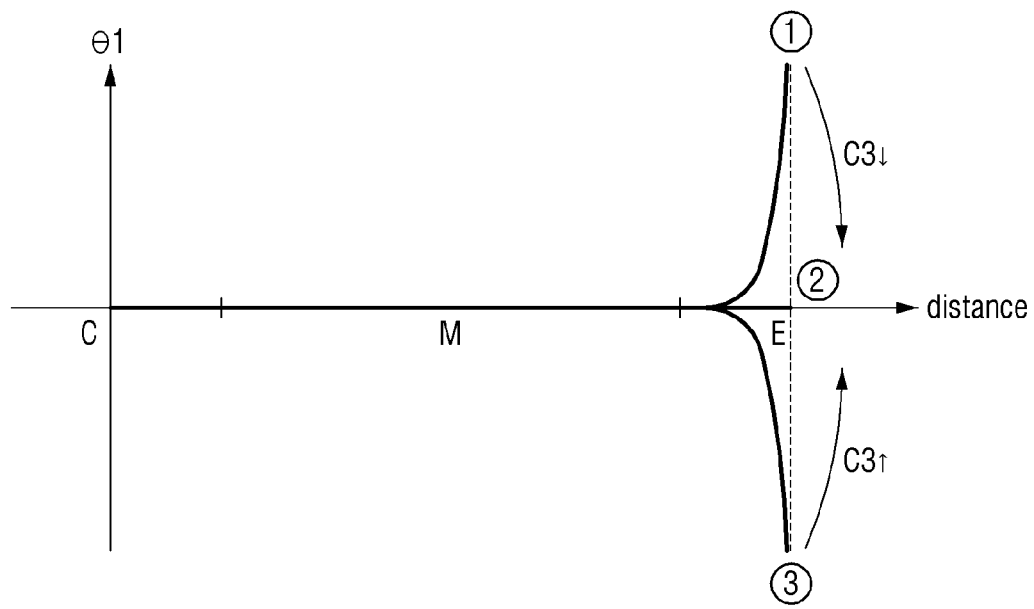
FIG. 8 is a graph of the dependence of etching direction on the position of the wafer on the plasma processing equipment according to examples of the present inventive concepts and a change depending on the magnitude of the capacitance of the second capacitor.

FIG. 8 is a graph illustrating dependence between the etching direction and the position of the wafer and the magnitude of the second capacitor in plasma processing equipment according to the present inventive concepts.

Referring to FIGS. 1 to 8, a wafer W may be considered as having a central region C, an intermediate region M and an edge region E. The central region C refers to a region near the center of the circular wafer W. The edge region E refers a region of the wafer W that includes the outer peripheral edge of the wafer. The intermediate region M refers to a region located between the central region C and the edge region E.

A first angle θ1 indicates the incident angle of plasma as was described with reference to FIG. 2. In particular, a positive first angle θ1 may mean that the plasma (direction of propagation) is inclined in the outward direction of the wafer W, that is, in a direction as illustrated by $\hat{1}$ in FIG. 2. A negative first angle θ1 means that the plasma is inclined in the inward direction of the wafer W, that is, in a direction as illustrated by $\hat{3}$. When the first angle θ1 is 0, the plasma is propagating in a direction perpendicular to the upper surface of the wafer W, that is, in the direction illustrated by $\hat{2}$.

The first angle θ1 is zero in the central region C and the intermediate region M and then may become larger or smaller than 0 in the edge region E. This means that the electric potential is maintained parallel to the upper surface of the wafer W in the central region C and the intermediate region M of the wafer W. However, the electric potential may be inclined for various reasons in the edge region E, and the first angle θ1 may be positive or negative in the edge region E.

When the magnitude of the capacitance of the third capacitor C3 of the series resonance circuit 330 is reduced, the first angle θ1 may decrease from a positive to zero. That is, the plasma becomes perpendicular changing direction from $\hat{1}$ to $\hat{2}$ in FIG. 2

Conversely, when the magnitude of the third capacitor C3 of the series resonance circuit 330 is increased, the first angle θ1 increases from a negative to zero. That is, the plasma becomes perpendicular changing direction from $\hat{3}$ to $\hat{2}$ in FIG. 2.

As described above, the controller 360 may control the magnitude of the capacitance of the third capacitor C3. Therefore, when the first angle θ1 is positive, the plasma may be controlled to propagate vertically (perpendicular to the upper surface of the wafer) at the edge region E by reducing the magnitude of the third capacitor C3. Similarly, when the first angle θ1 is negative, the plasma may be controlled to propagate vertically at the edge region E by increasing the magnitude of the third capacitor C3.

The plasma processing equipment according to the inventive concepts may control the electric potential of the edge region E of the wafer W by providing the edge electrode 225 inside the dielectric ring 220. As a result, the plasma at the edge region E of the wafer W may be controlled to be perpendicular the upper surface at the edge region E, and thus, the etch rate of the wafer may be made uniform across all of the wafer W.

Hereinafter, another example of a filter circuit of the plasma processing equipment according to the present inventive concepts will be described referring to FIG. 9. The corresponding parts of the above description will be simplified or omitted.

Figure 9:
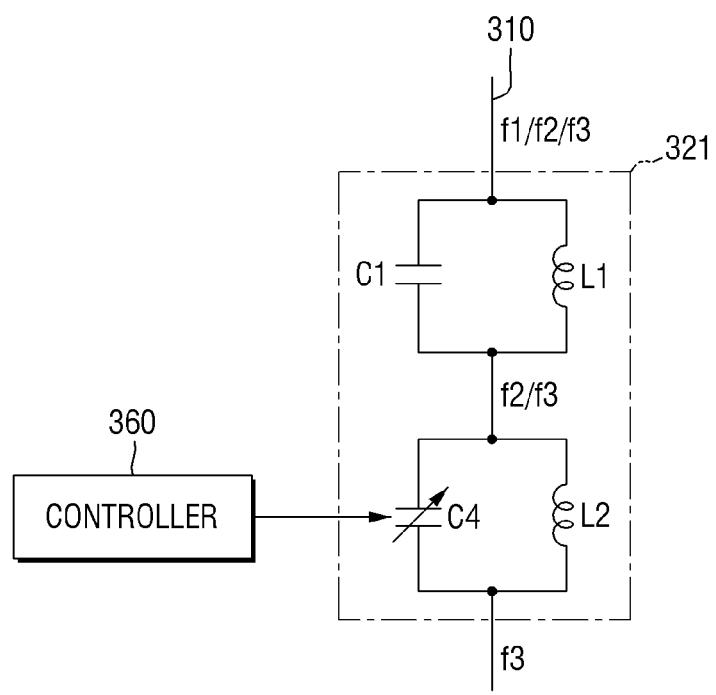
FIG. 9 is an equivalent circuit diagram of a filter circuit of plasma processing equipment according the present inventive concepts.

Referring to FIG. 9, another example of plasma processing equipment according to the present inventive concepts includes a filter circuit 321.

The second parallel resonance circuit of the filter circuit 321 may include a capacitor C4 and a second coil L2. The capacitor C4 in this example is a variable capacitor. The magnitude of the capacitance of the capacitor C4 may be controlled by the controller 360. The filtered signal of the filter circuit 321 may be controlled as the magnitude of the capacitance of the capacitor C4 is controlled.

The filter circuit 321 serves to block the signal of the first frequency f1 and the signal of the second frequency f2 but note the signal of the third frequency f3. In this way, when replacing the frequency of the second signal of the second frequency f2 of the AC power supply 400 with another frequency, the capacitance of the capacitor C4 may be adjusted by the controller 360 without requiring the replacement of the capacitor C4 of the filter circuit 321. Thus, plasma processing equipment employing the filter circuit 321 according to the present inventive concepts may easily cope with any change in frequency of the second signal (signal of the second frequency f2).

Hereinafter, another example of plasma processing equipment according to the present inventive concepts will be described referring to FIGS. 10 and 11. The corresponding parts of the above description will be simplified or omitted.

Figure 10:
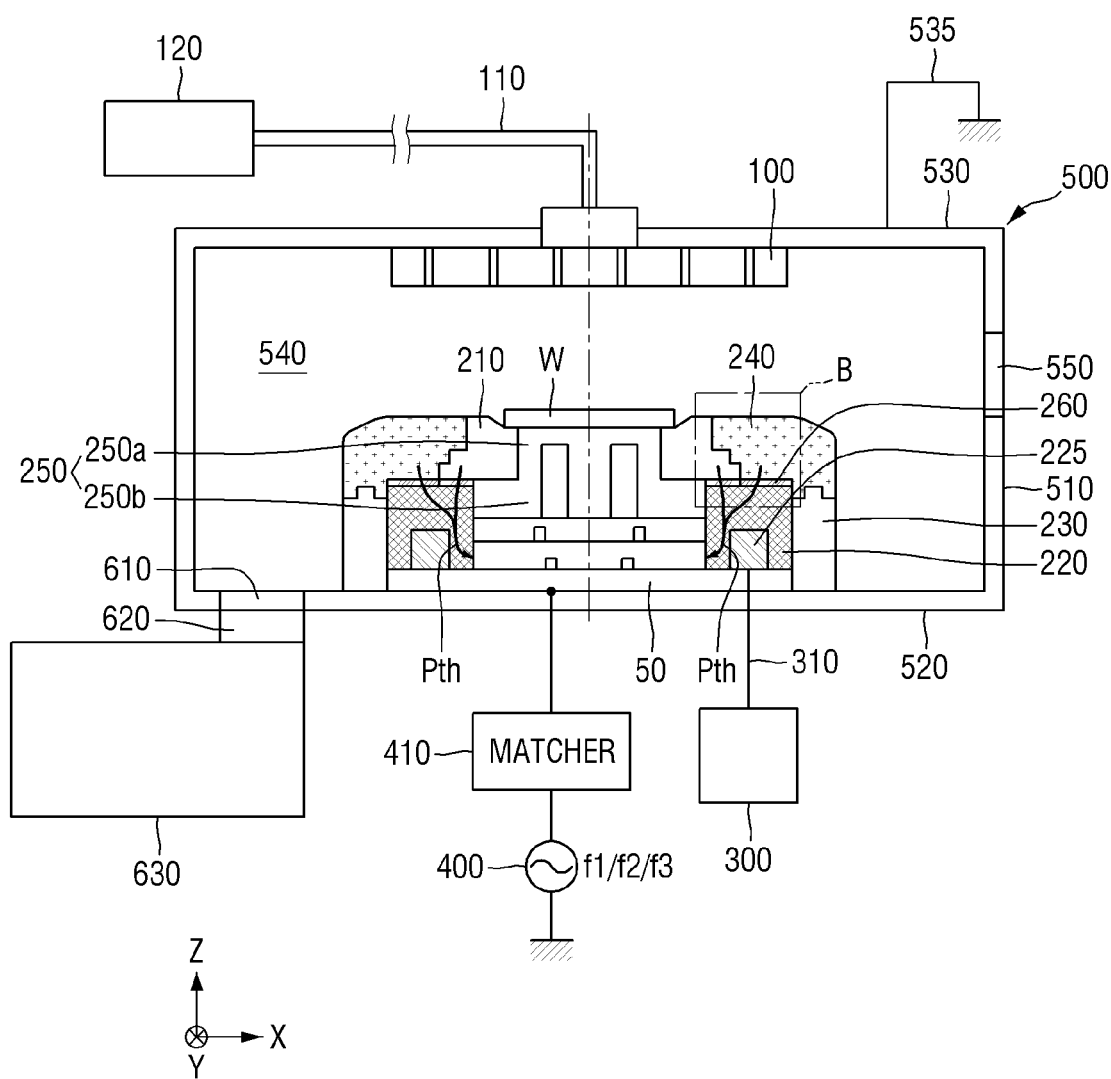
FIG. 10 is a schematic diagram of still another example of plasma processing equipment according to the present inventive concepts.
Figure 11:
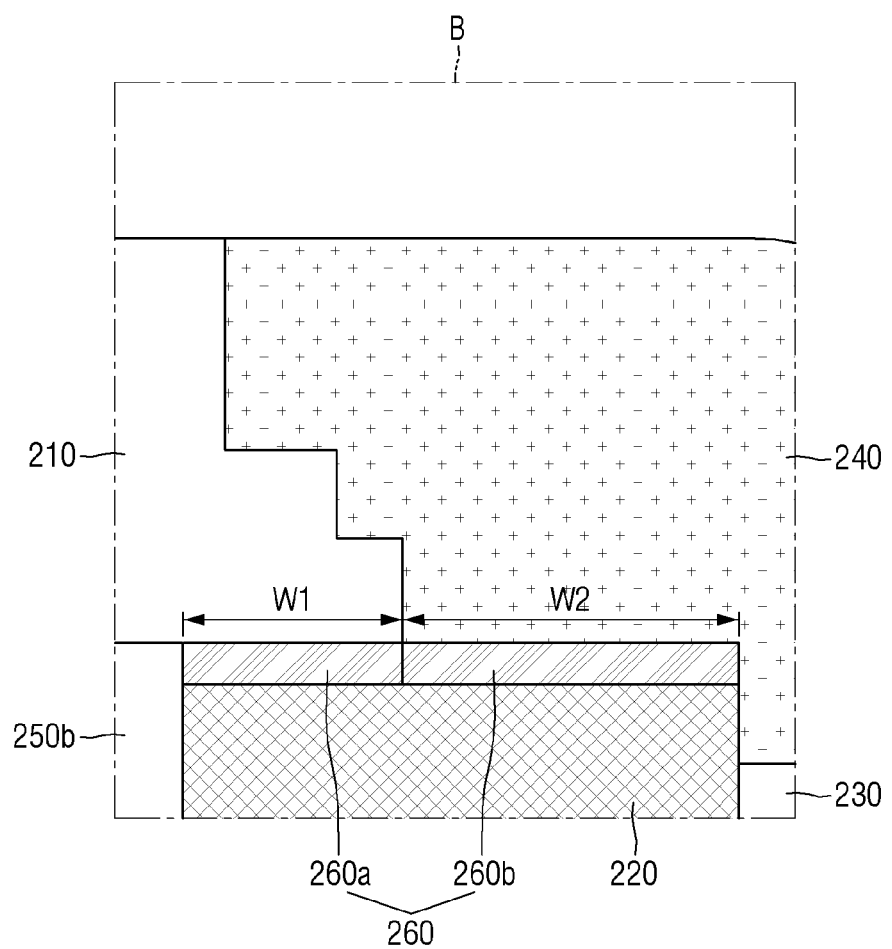
FIG. 11 is an enlarged view of a part B of FIG. 10.

Referring to FIGS. 10 and 11, the plasma processing equipment further includes a thermal pad 260.

The thermal pad 260 may be located between the dielectric ring 220 and the first edge ring 210 and the second edge ring 240. Specifically, the thermal pad 260 may be located on the dielectric ring 220 and may be located under the first edge ring 210 and the second edge ring 240. The thermal pad 260 may be in contact with the first edge ring 210, the second edge ring 240 and the dielectric ring 220. The thermal pad 260 may serve to discharge heat of the first edge ring 210 and the second edge ring 240.

Specifically, the thermal pad 260 may receive heat of the first edge ring 210 and the second edge ring 240 and may transfer the heat to the dielectric ring 220. The dielectric ring 220 may transfer the heat to the chuck stage 250. That is, the chuck stage 250 may serve as a heat sink of the first edge ring 210 and the second edge ring 240. A thermal path Pth may start from the first edge ring 210 and the second edge ring 240 to lead to the chuck stage 250 via the thermal pad 260 and the dielectric ring 220.

During the plasma process, the first edge ring 210 and the second edge ring 240 may have different temperatures. These different temperatures may be attributed to the material, shape, position, etc. of the first edge ring 210 and the second edge ring 240.

That is, for example, in a case in which the first edge ring 210 includes Si and the second edge ring 240 includes $SiO_2$, the thermal conductivities differ greatly from each other and hence, the first edge ring 210 and the second edge ring 240 may have different temperatures. Or, even if the first edge ring 210 and the second edge ring 240 are of the same material, because the shapes and arrangements of the rings are different from each other, they may have different temperatures.

In such a case, because the reactivity of the etchant varies depending on the temperature, the etch rate of the edge region E of the wafer W may vary amongst the portions adjacent to the first edge ring 210 and the second edge ring 240. In such a case, the reliability of the semiconductor element in the edge region E of the wafer W may be dramatically lowered.

The thermal pad 260 may include a first part 260a and a second part 260b. The first part 260a may be in contact with the first edge ring 210. The second part 260b may be in contact with the second edge ring 240. The first part 260a and the second part 260b may discharge different amounts of heat, respectively, in order to equalize the temperatures at the first edge ring 210 and the second edge ring 240.

To this end, the width W1 of the first part 260a may be smaller than the width W2 of the second part 260b. However, the present inventive concepts is not limited to these examples. If the heat to be discharged from the second edge ring 240 is less, the width W2 may be smaller than the width W1. That is, the width W1 and the width W2 may be set to reduce a temperature difference between the first edge ring 210 and the second edge ring 240.

As the width W1 and the width W2 differ, the area ratio of the first part 260a and the second part 260b may also differ. That is, the rate between the area in which the first edge ring 210 and the first part 260a are in contact with each other, and the area in which the second edge ring 240 and the second part 260b are in contact each other may be different from each other.

The first part 260a and the second part 260b in this example are of the same material as each other. The first part 260a and the second part 260b may include metals, respectively, but are not limited thereto.

In this example, because the first part 260a and the second part 260b discharge different amounts of heat from each other, the temperatures of the first edge ring 210 and the second edge ring 240 are similar. The etch rate of the edge region E of the wafer W may be made uniform accordingly. Therefore, the performance and reliability of the semiconductor element in the edge region E of the wafer W may be improved.

Hereinafter, another example of the thermal pad of plasma processing equipment according to the present inventive concepts will be described referring to FIG. 12. The corresponding parts of the above description will be simplified or omitted.

Figure 12:
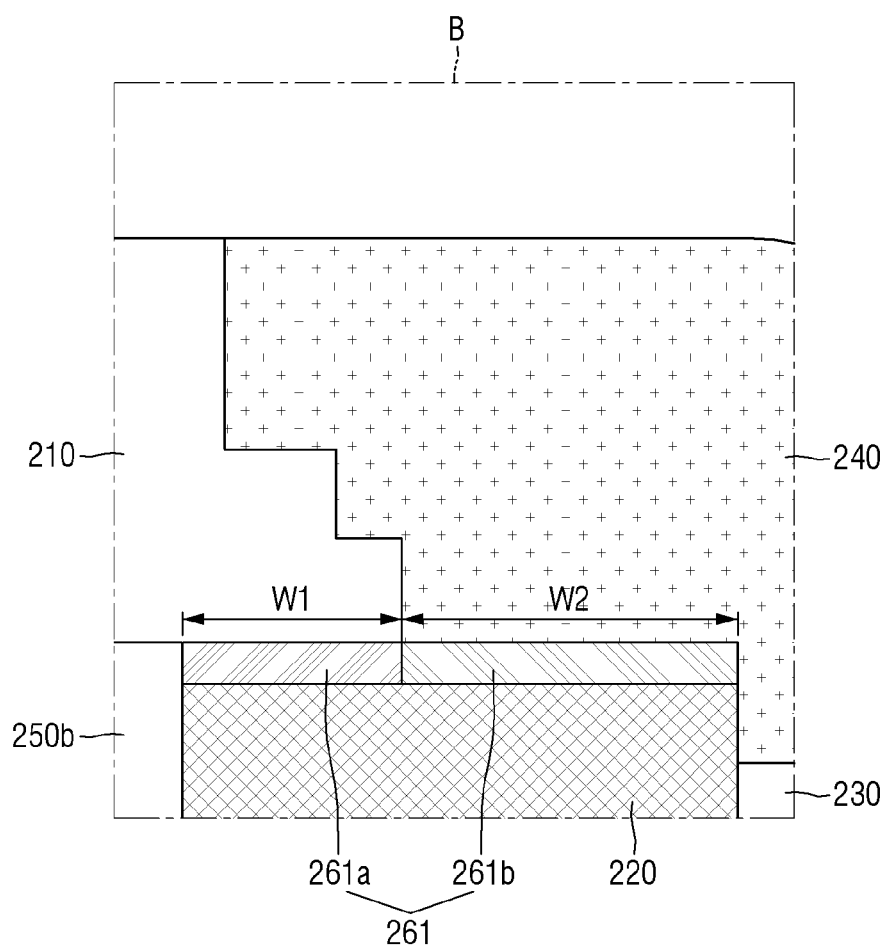
FIG. 12 is an enlarged view of another version of part B of FIG. 10.

Referring to FIG. 12, the first part 261a and the second part 261b of the thermal pad 261 are of different materials from each other. Therefore, the thermal conductivities of the first part 261a and the second part 261b are different from each other.

If the temperature of the second edge ring 240 is higher than the temperature of the first edge ring 210, the thermal conductivity, that is, the thermal resistance of the second part 261b may be higher than the thermal conductivity of the first part 261a. Of course, this may be defined in consideration of the influence of the first width W1 and the second width W2.

That is, in the present example, the temperature difference between the first edge ring 210 and the second edge ring 240 may be reduced in consideration of the area ratios of the first part 261a and the second part 261b and the thermal resistance. That is, the thermal pad 261 may discharge heat at different rates from the first edge ring 210 and the second edge ring 240 owing to difference in the materials of the rings. As a result, a difference in temperature between the first edge ring 210 and the second edge ring 240 is decreased or eliminated, and the etch rate of the edge region E of the wafer W may become uniform.

Through this, the performance and reliability of the semiconductor element in the edge region E of the wafer W may be greatly improved.

Hereinafter, another example of the thermal pad of plasma processing equipment according to the present inventive concepts will be described referring to FIG. 13. The corresponding parts of the above description will be simplified or omitted.

Figure 13:
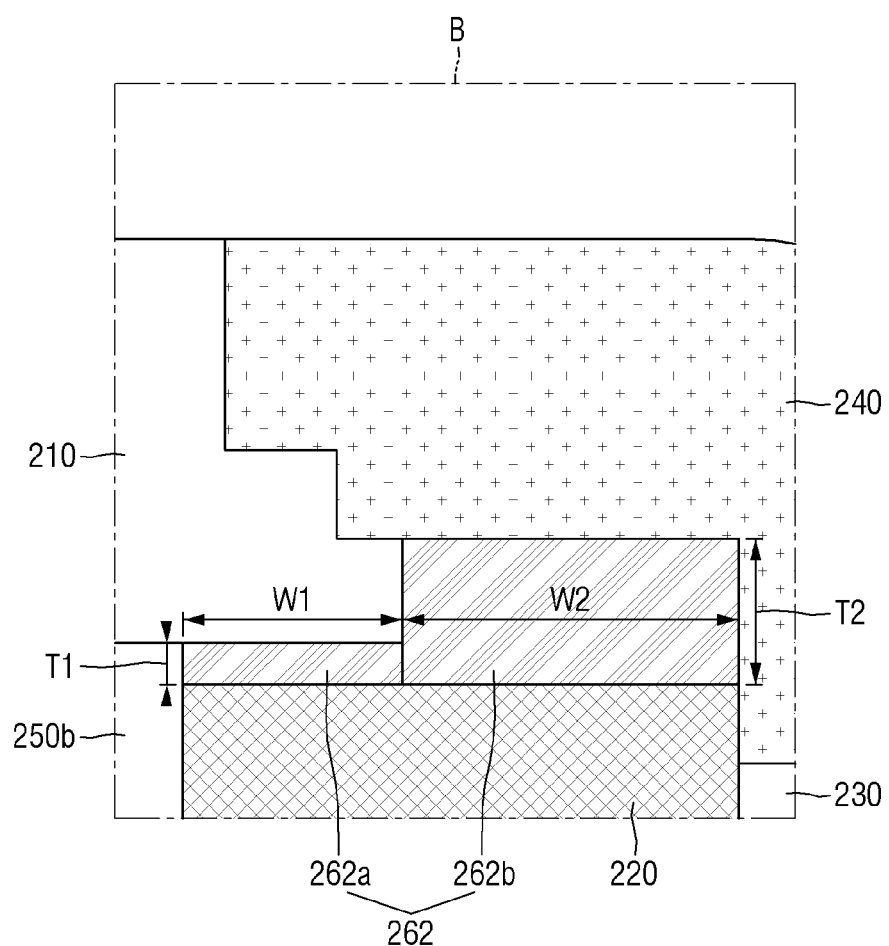
FIG. 13 is an enlarged view of still another version of part B of FIG. 10.

Referring to FIG. 13, a first part 262a and a second part 262b of the thermal pad 262 of the plasma processing equipment have different thicknesses from each other.

Specifically, the first part 262a may have a thickness T1 and the second part 262b may have a thickness T2 greater than the thickness T1. However, the present inventive concepts is not limited to this example. Rather, the thickness T2 of the second part 262b may be less than the thickness T1 of the first part 262a.

In any case, the first part 262a and the second part 262b may be specified (width W1, width W2, thickness T1 and thickness T2) to reduce the difference between the temperatures of the first edge ring 210 and the second edge ring 240. That is, the temperature difference between the first edge ring 210 and the second edge ring 240 may be reduced by controlling the area ratio and the thickness of the first part 262a and the second part 262b. As a result, the difference in the process temperature between the first edge ring 210 and the second edge ring 240 decreases or disappears, and the etch rate of the edge region E of the wafer W may become uniform.

Hereinafter, another example of plasma processing equipment according to the present inventive concepts will be described referring to FIG. 14. The corresponding parts of the above description will be simplified or omitted.

Figure 14:
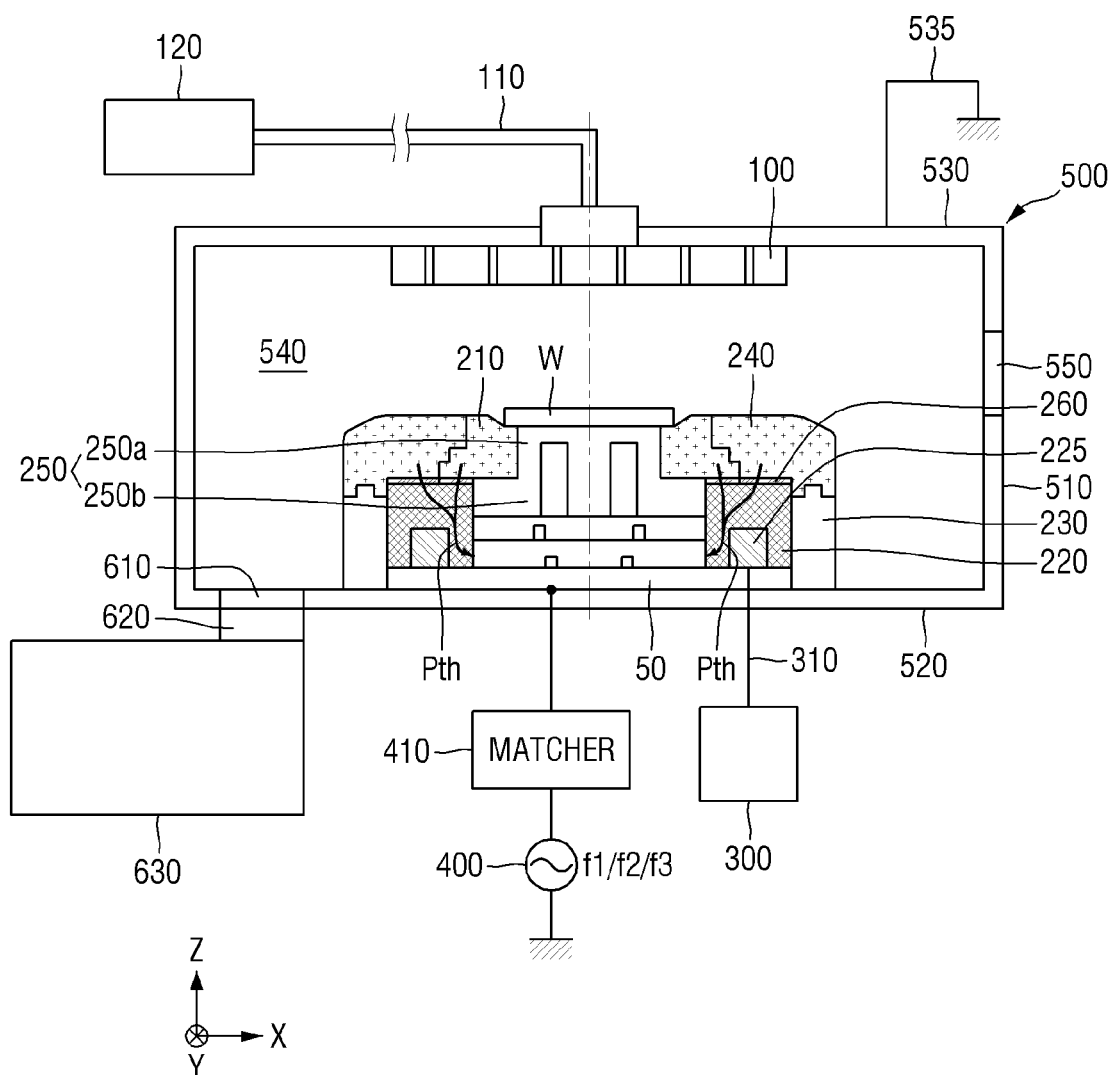
FIG. 14 is a schematic diagram of another example of plasma processing equipment according to the present inventive concepts.

Referring to FIG. 14, the first edge ring 210 and the second edge ring 240 are of the same material as each other. Of course, because there is also a difference in the shape between the first edge ring 210 and the second edge ring 240, and the arranged positions of the first edge ring 210 and the second edge ring 240 are also different, their respective temperatures may not be the same. However, because in this example the first edge ring 210 and the second edge ring 240 are made of the same material, the first edge ring 210 and the second edge ring 240 may have the similar temperatures to each other.

In such a case, too, the thermal pad 260 may more efficiently and accurately decrease the temperature difference between the first edge ring 210 and the second edge ring 240. Therefore, the etch rate of the edge region E of the wafer W becomes uniform, and the performance of the semiconductor element formed at the edge region E of the wafer W may also be improved.

Although not illustrated, the first part 260a and the second part 260b of the thermal pad 260 of the plasma processing equipment according to the present inventive concepts may be of different materials, and have different area ratios and thicknesses. Alternatively, in the first part 260a and the second part 260b of the thermal pad 260 of the plasma processing equipment according to the present inventive concepts, any one characteristic of the material, the area ratio and the thickness of the first part 260a and the second part 260b may be different, and the other characteristics may be the same. That is, the controlling characteristics of the first part 260a and the second part 260b for reducing the temperature difference between the first edge ring 210 and the second edge ring 240 are not limited.

Hereinafter, another example of plasma processing equipment according to the present inventive concepts will be described referring to FIGS. 15 and 16. The corresponding parts of the above description will be simplified or omitted.

Figure 15:
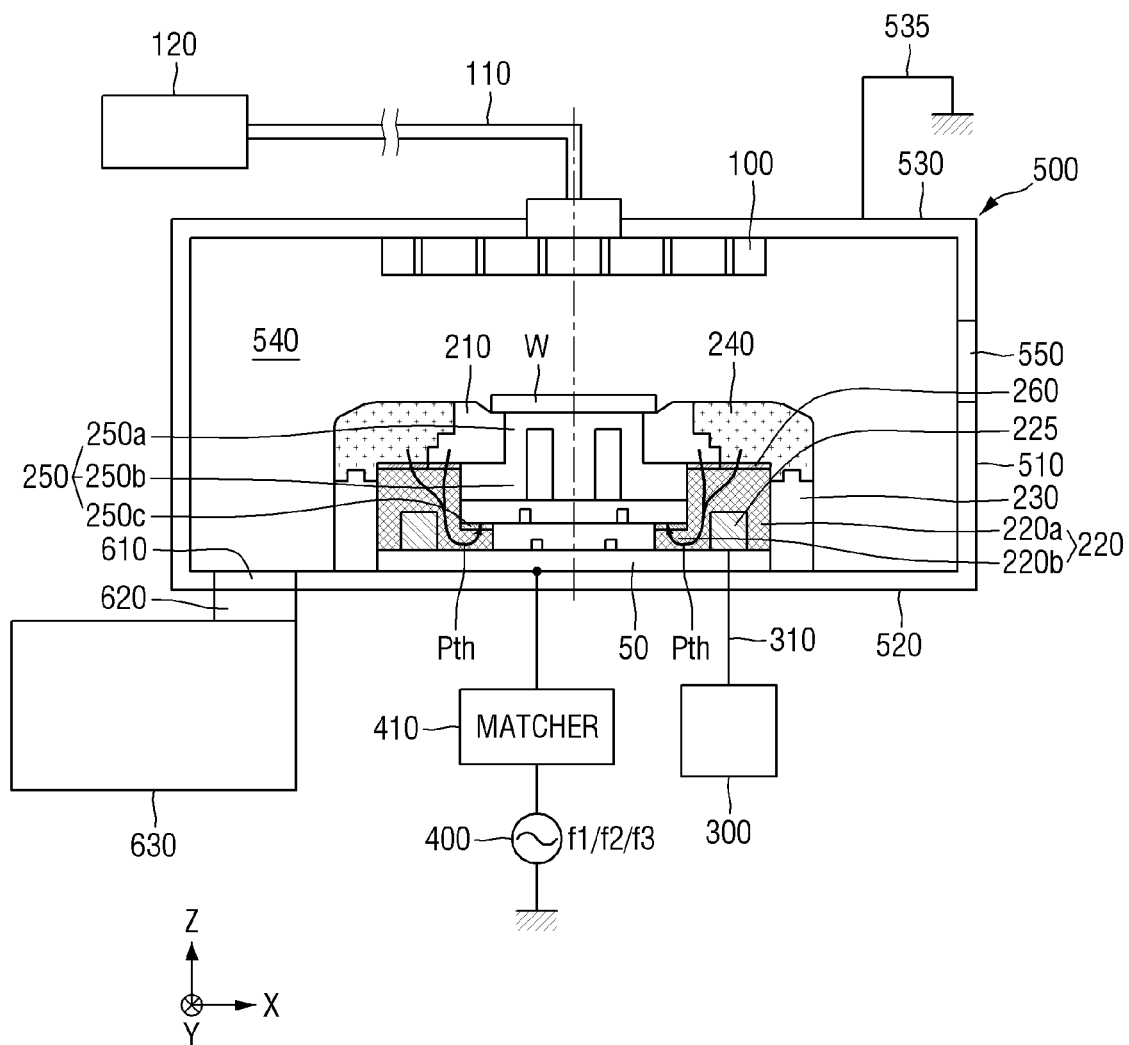
FIG. 15 is a schematic diagram of still another example of plasma processing equipment according to the present inventive concepts.
Figure 16:
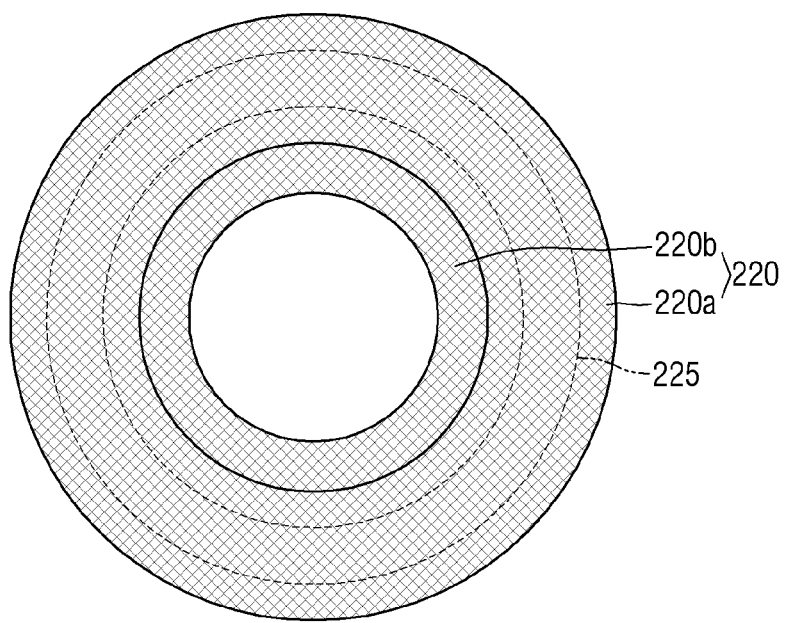
FIG. 16 is a plan view of the dielectric ring and the edge electrode of the plasma processing equipment of FIG. 15.

Referring to FIGS. 15 and 16, the chuck stage 250 may include a thermally conductive electrode 250c. Specifically, the chuck stage 250 may include an upper part 250a, a lower part 250b and the thermally conductive electrode 250c. The thermally conductive electrode 250c may be attached to the lower surface of the lower part 250b of the chuck stage 250. The thermally conductive electrode 250c may comprise a metal.

The thermally conductive electrode 250c may serve as a passage through which external heat is transferred to the chuck stage 250 which is a heat sink.

The dielectric ring 220 may have a lateral dielectric ring section 220a and a lower dielectric ring section 220b. The lateral dielectric ring section 220a may surround a side surface of the chuck stage 250. The lateral dielectric ring section 220a may be in contact with the side surface of the chuck stage 250.

The lateral dielectric ring section 220a may surround the edge electrode 225. That is, the periphery of the edge electrode 225 may be blocked by the lateral dielectric ring section 220a. In particular, the chuck stage 250 is in contact with the lateral dielectric ring section 220a, but the chuck stage 250 may be separated from the edge electrode 225.

The lower dielectric ring section 220b may be in contact with the lower surface of the chuck stage 250. Also, the lower dielectric ring section 220b may be in contact with the upper surface of the base 50. The lower dielectric ring section 220b protrudes from the lateral dielectric ring section 220a toward the chuck stage 250. The upper surface of the lower dielectric ring 220b may be situated at a level below that of the upper surface of the lateral dielectric ring 220a. Therefore, a step may be formed between the lower dielectric ring section 220b and the upper surface of the lateral dielectric ring section 220a.

The thermal path Pth from which heat is discharged from the first edge ring 210 and the second edge ring 240 starts from the first edge ring 210 and the second edge ring 240, passes through the thermal pad 260, the lateral dielectric ring section 220a, and the lower dielectric ring section 220b, and may lead to the chuck stage 250 via the thermally conductive electrode 250c of the chuck stage 250.

The plasma processing equipment according to the present example may more efficiently perform the heat discharge using the first edge ring 210 and the second edge ring 240, including the thermally conductive electrode 250c. This makes it possible to more easily reduce the process temperature difference between the first edge ring 210 and the second edge ring 240.

If the process temperatures of the first edge ring 210 and the second edge ring 240 are the same or similar, the etch rate on the wafer W becomes uniform and the performance and reliability of the semiconductor device can be dramatically improved.

Hereinafter, another example of plasma processing equipment according to the present inventive concepts will be described with reference to FIGS. 17 and 18. The corresponding parts of the above description will be simplified or omitted.

Figure 17:
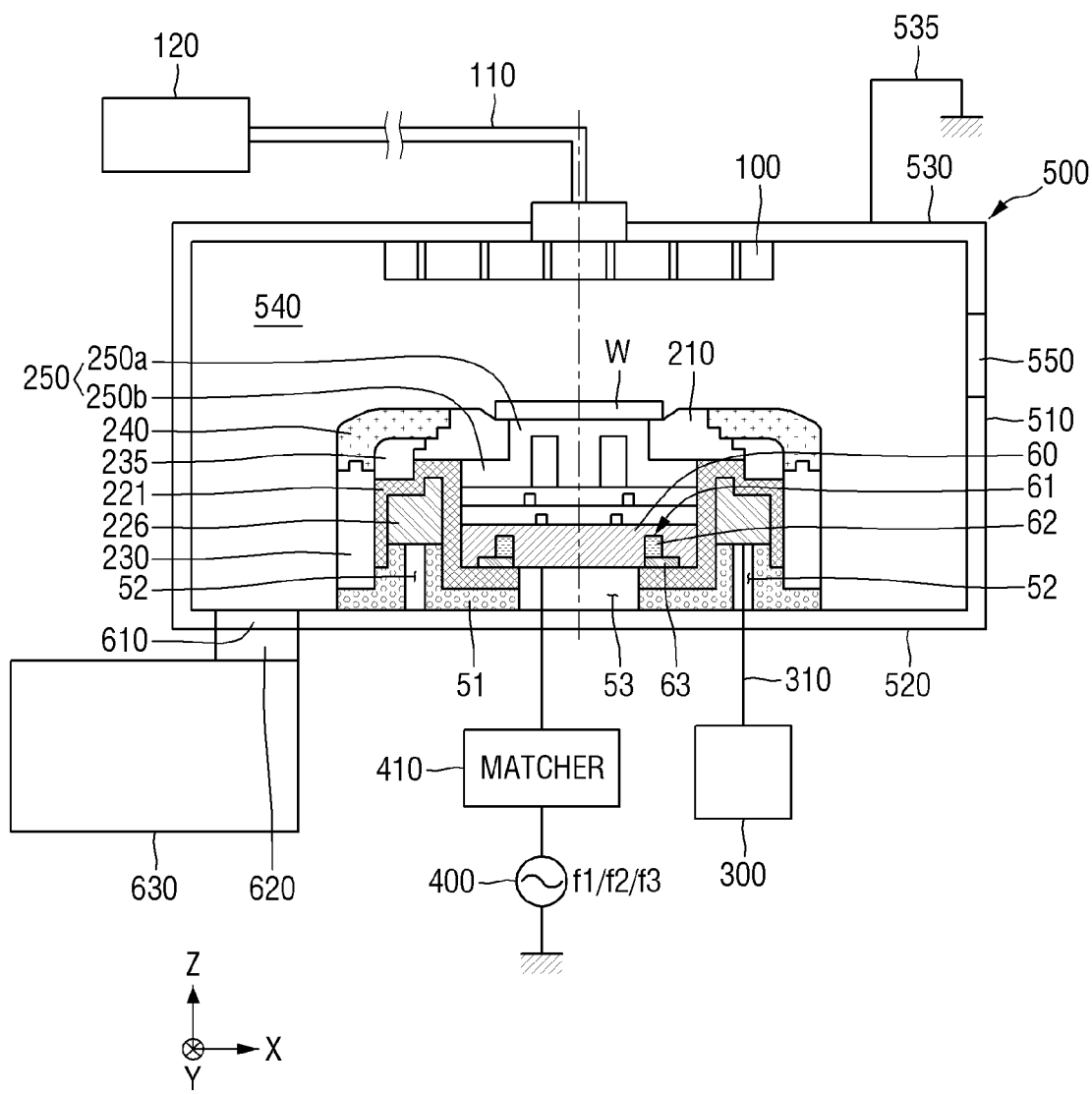
FIG. 17 is a schematic diagram of another example of plasma processing equipment according to the present inventive concepts.
Figure 18:
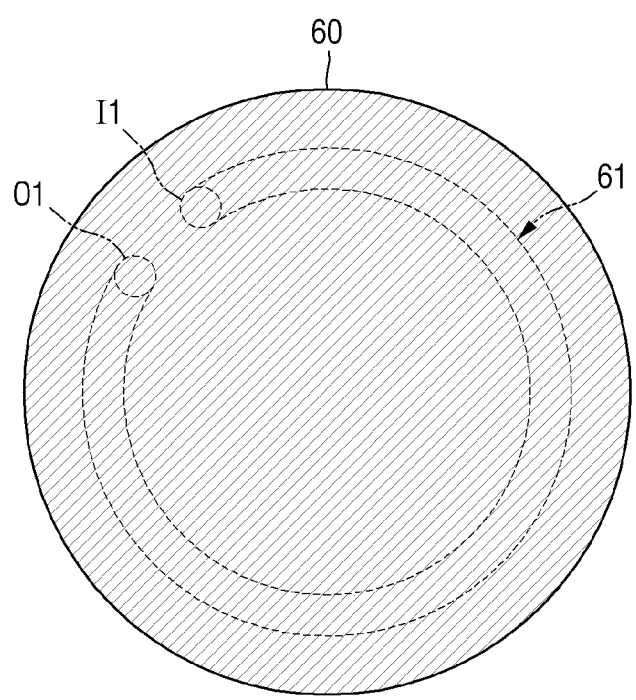
FIG. 18 is a plan view of an RF plate and a cooling unit of the plasma processing equipment of FIG. 17.

Referring to FIGS. 17 and 18, the plasma processing equipment may include an RF plate 60, a base structure 51, a support ring 235, a dielectric ring 221, a edge electrode 226, a cooling unit 61, a refrigerant 62, and a cooling thermal pad 63.

The RF plate 60 may be located under the chuck stage 250. The RF plate 60 may comprise Al, for example, but the present inventive concepts are not limited to having an RF plate of Al. The RF plate 60 may be a lower electrode for plasma fixation. That is, voltages for the plasma process may be applied to the RF plate 60 and the gas feeder 100 as a lower electrode and an upper electrode, respectively. The RF plate 60 may be connected to a matcher 410 and an AC power supply 400.

The RF plate 60 may prevent a non-uniform electric field from being formed due to the presence of a conductor under the RF plate 60. That is, the electric field on the wafer W may be uniformly formed by the RF plate 60.

The base structure 51 may support the RF plate 60, the dielectric ring 221, the edge electrode 226 and the outer wall 230. The base structure 51 may include a first hole 52 and a second hole 53. The first hole 52 may be a hole through which the control line 310 connected to the edge electrode 226 passes. The second hole 53 may be a hole through which the RF plate 60 and the matcher 410 and AC power supply 400 are connected to each other. The first hole 52 may be an annular opening surrounding the second hole 53.

The support ring 235 may be located between portions of the first edge ring 210 and the second edge ring 240. The first edge ring 210, the support ring 235 and the second edge ring 240 may be discrete parts as illustrated in the drawing, but they may instead be unitary or may be altogether be constituted by other forms of discrete parts.

The dielectric ring 221 surrounds the side surface of the chuck stage 250 and may be in contact with a lower part of the chuck stage 250. Specifically, the dielectric ring 221 may surround the lower part 250b of the chuck stage 250. The first edge ring 210, the support ring 235 and the second edge ring 240 may be located on the dielectric ring 221. A step may be formed on the upper surface of the dielectric ring 221 depending on the shapes and relative positions of the lower surfaces of the first edge ring 210 and the support ring 235.

The dielectric ring 221 is formed of a dielectric and may surround the edge electrode 226 except for its lower surface. The lower surface of the edge electrode 226 may be supported by the base structure 51 and exposed by the first hole 52. That is, the edge electrode 226 may be located inside the dielectric ring 221. The edge electrode 226 comprises a conductor.

The edge electrode 226 may be coupled to the chuck stage 250 and the lower electrode of the RF plate 60 to tune the potential of the edge region of the wafer. The edge electrode 226 may be connected to the resonance circuit 300.

The cooling unit 61 comprises a cooling line located inside the RF plate 60. The cooling line of the cooling unit 61 provides a passageway, e.g., a substantially circular channel, in the RF plate 60. The cooling line of the cooling unit 61 may include an inlet I1 and an outlet O1. The cooling unit 61 may include a refrigerant (coolant) 62 filling the cooling line.

The refrigerant 62 may be liquid. The refrigerant 62 is, for example, ethylene glycol, but the present inventive concepts are not limited thereto.

The refrigerant 62 is injected into the RF plate 60 by a pump of a pump system (not shown) of the cooling unit 61 via the inlet I1, moves along the cooling unit 61, and then is discharged from the RF plate 60 through the outlet O1. Although the inlet I1 and the outlet O1 are spaced from each other in the example shown in the drawing, in an example of plasma processing equipment according to the present inventive concepts, one opening connected to a pump of the cooling unit 61 may serve as the inlet and outlet of the RF plate 60 for the refrigerant with the timing/operation of the pump being controlled appropriately to force the refrigerant 61 into and withdraw the refrigerant 61 from the RF plate 60 by way of the single opening.

The cooling thermal pad 63 may be located in the RF plate 60. Specifically, the cooling thermal pad 63 may be located between the dielectric ring 221 and the cooling unit 61. The cooling thermal pad 63 may transfer heat between the cooling unit 61 and the dielectric ring 221.

The edge electrode 226 of the present example utilizes a high bias power to change the electric field, and may adjust an incident angle of ions or radicals of plasma in such a case.

During operation, a large number of ions and radicals may collide with the first edge ring 210, and the temperature of the first edge ring 210 may increase accordingly. The resulting heating of the first edge ring 210 may increase the temperature of the dielectric ring 221 and the edge electrode 226 located under the first edge ring 210. If this state were allowed to go unchecked, the dielectric ring 221 and the edge electrode 226 would not function stably, and the dielectric ring 221 and the edge electrode 226 could break or malfunction due to thermal expansion. Therefore, an aspect of the present inventive concepts is the provision of a scheme for controlling the temperatures of the dielectric ring 221 and the edge electrode 226.

More specifically, in the plasma processing equipment according to the present inventive concepts, the cooling unit 61 and in particular, the cooling line containing refrigerant, is thermally coupled to the dielectric ring 221 and the edge electrode 226 by the cooling thermal pad 63. The cooling unit 61 lowers the temperature of the dielectric ring 221 and the edge electrode 226 via the cooling thermal pad 63, thereby controlling the temperature of the dielectric ring 221 and the edge electrode 226. As a result, it is possible to reduce the risk of malfunction and damage of the plasma processing equipment.

Hereinafter, another example of plasma processing equipment according to the present inventive concepts will be described referring to FIG. 19. The corresponding parts of the above description will be simplified or omitted.

Figure 19:
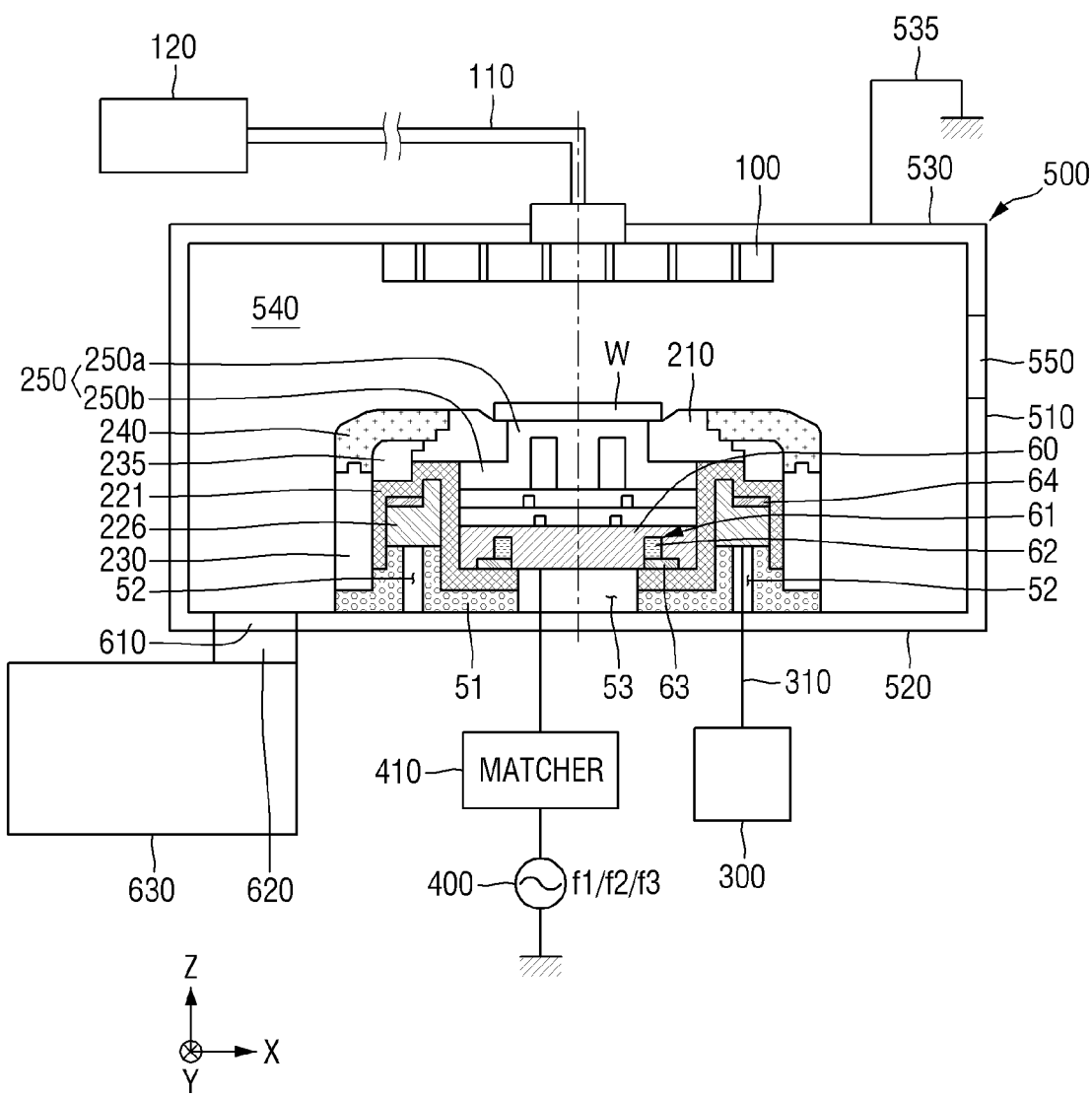
FIG. 19 is a schematic diagram of another example of plasma processing equipment according to the present inventive concepts.

Referring to FIG. 19, the plasma processing equipment of this example includes a second cooling thermal pad 64.

The second cooling thermal pad 64 may be located between the dielectric ring 221 and the edge electrode 226 and serve as part of the system by which the cooling line containing refrigerant 62 is thermally coupled to the dielectric ring 221 and the edge electrode 226. The second cooling thermal pad 64 may transfer heat between the dielectric ring 221 and the edge electrode 226.

Thus, the plasma processing equipment of this example can efficiently transfer heat generated in the edge electrode 226 to the cooling unit 61. Specifically, the heat of the edge electrode 226 may be transferred to the cooling unit 61 via the second cooling thermal pad 64, the dielectric ring 221, and the cooling thermal pad 63.

Hereinafter, another example of plasma processing equipment according to the present inventive concepts will be described with reference to FIGS. 20 and 21. The corresponding parts of the above description will be simplified or omitted.

Figure 20:
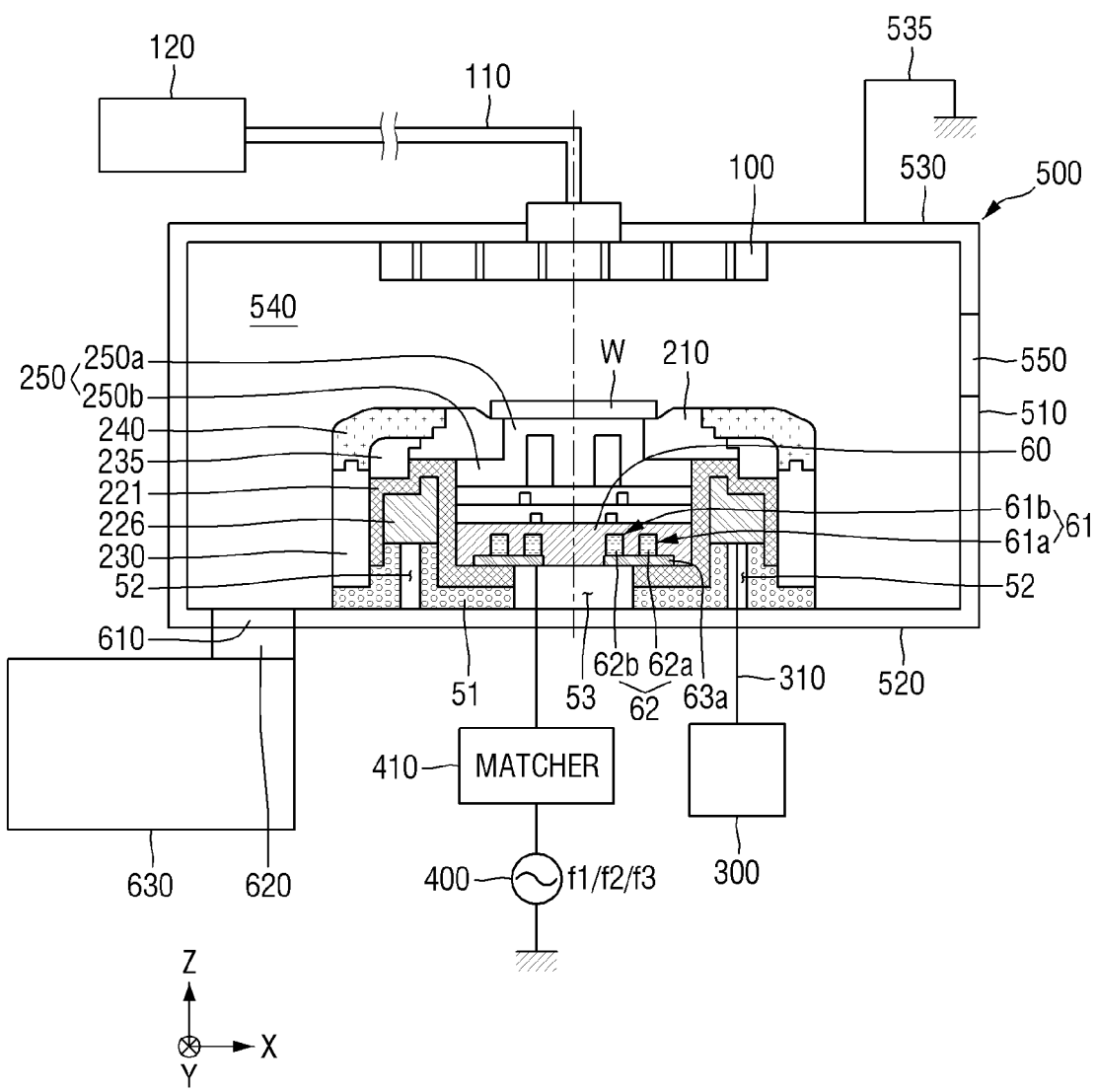
FIG. 20 is a schematic diagram of still another example of plasma processing equipment according to the present inventive concepts.
Figure 21:
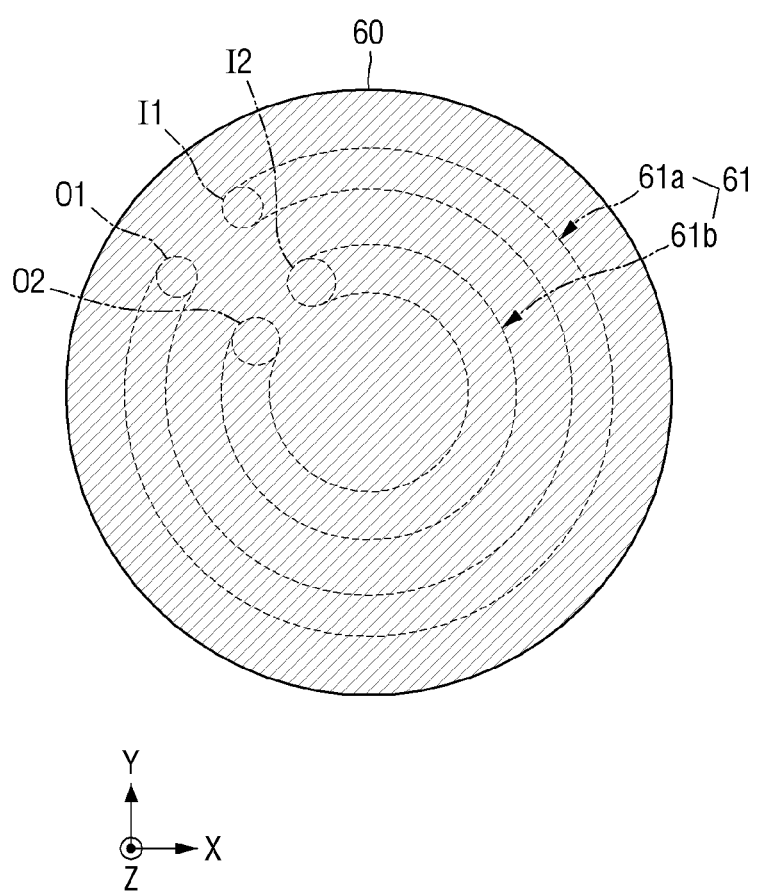
FIG. 21 is a plan view for explaining the RF plate and the cooling unit of FIG. 20 in detail.

Referring to FIGS. 20 and 21, the plasma processing equipment of this example includes a two-channel cooling unit 61 and a cooling thermal pad 63a.

That is, the cooling unit 61 has a cooling line including a first channel and a second channel. The first channel may be a circular channel in the RF plate 60, and the second channel may also be a circular channel in the RF plate 60 and may be surrounded by the first channel.

The first channel may confine a refrigerant 62a therein and the second channel may confine a second refrigerant 62b therein. The refrigerant 62a and the second refrigerant 62b may be the same type of liquid.

The refrigerant 62a is injected into the first channel via the first inlet I1, moves along the first channel, and then may be discharged from the RF plate 60 through the first outlet O1. The second refrigerant 62b is injected into the second channel via the second inlet I2, moves along the second channel, and then is discharged through the second outlet O2. The cooling unit 61 may also include an appropriate pumping system of one or more pumps to pump the refrigerant 62a and the second refrigerant 62b through the first channel and the second channel, respectively.

The cooling thermal pad 63a may be in contact with both the first channel and the second channel. The cooling thermal pad 63a may be located in the RF plate 60. The cooling thermal pad 63a may be located between the dielectric ring 221 and the cooling unit 61. The cooling thermal pad 63a may thermally couple, i.e., transfer heat between the cooling unit 61 and the dielectric ring 221.

In the present example, a highly effective temperature control of the dielectric ring 221 and the edge electrode 226 is provided by the cooling unit 61 having two channels.

Hereinafter, another example of plasma processing equipment according to the present inventive concepts will be described with reference to FIGS. 22 and 23. The corresponding parts of the above description will be simplified or omitted.

Figure 22:
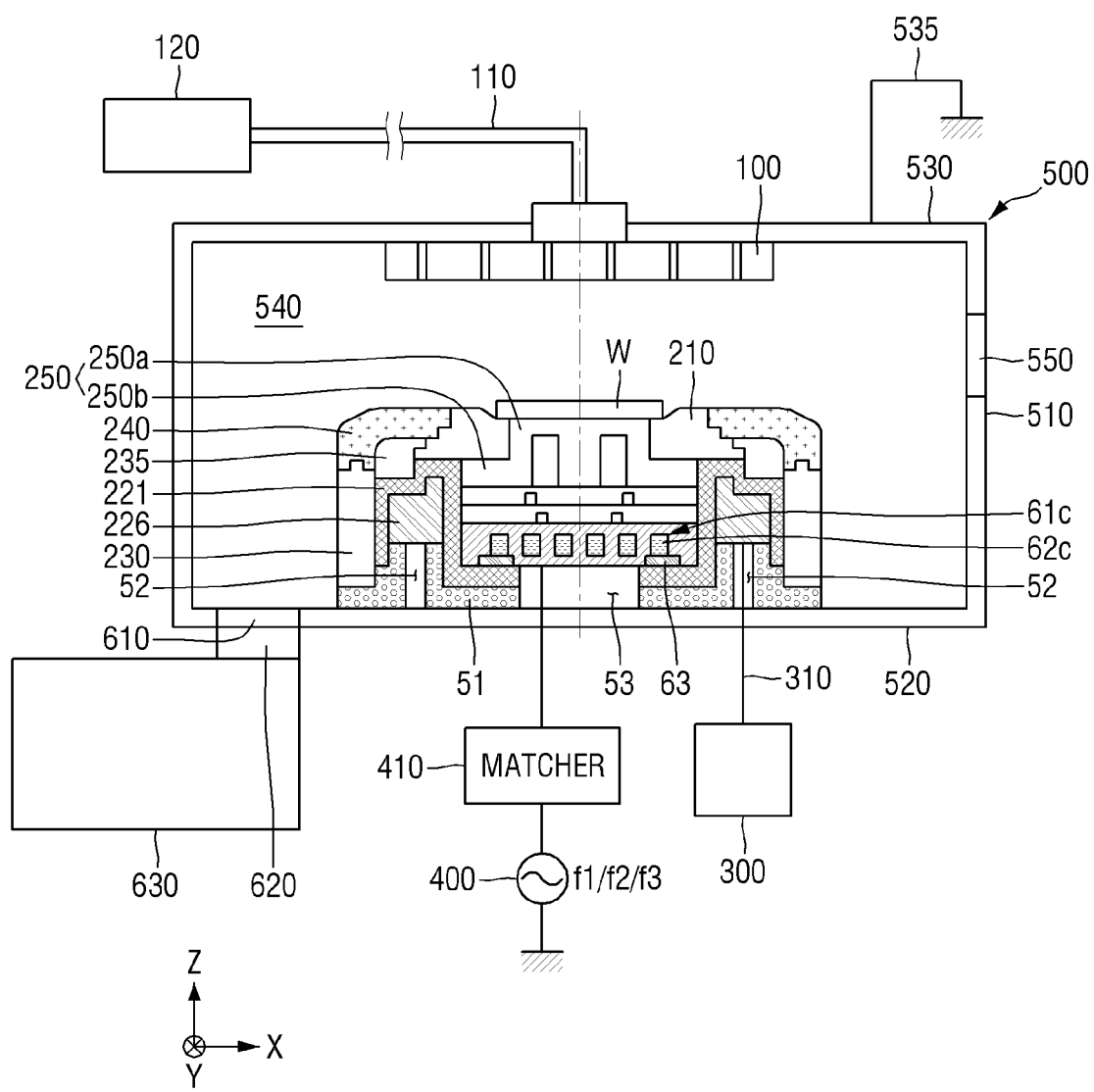
FIG. 22 is a conceptual diagram for explaining the plasma processing equipment according to some embodiments of the present inventive concepts.
Figure 23:
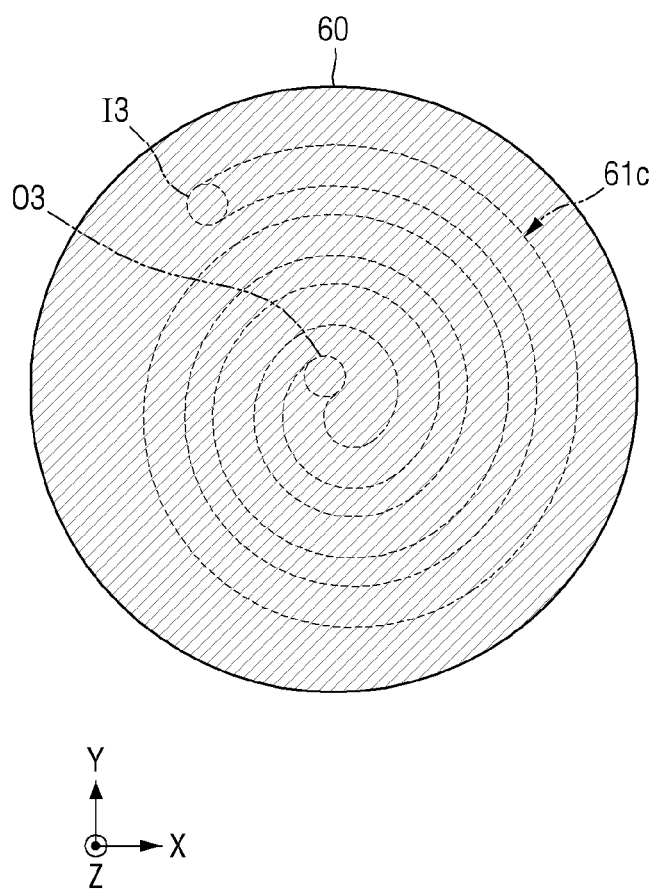
FIG. 23 is a plan view of the RF plate and the cooling unit of the plasma processing equipment of FIG. 22.

Referring to FIGS. 22 and 23, the plasma processing of this example includes a cooling unit 61c.

The cooling unit 61c has a cooling line including a passageway in the form of a spiral channel in the RF plate 60. The cooling line of the cooling unit 61 may have an inlet I3 and an outlet O3. The cooling line of the cooling unit 61c may confine a refrigerant 62c therein. The refrigerant 62c is injected into the passageway by a pump of a pump system (not shown) via the inlet I3, moves along the passageway, and then is discharged through the outlet O3.

In this example, a temperature control of the dielectric ring 221 and the edge electrode 226 may be effectively provided with a relatively simple unit including a cooling line that presents a relatively large area for heat transfer.

Hereinafter, another example of plasma processing equipment according to the present inventive concepts will be described with reference to FIG. 24. The corresponding parts of the above description will be simplified or omitted.

Figure 24:
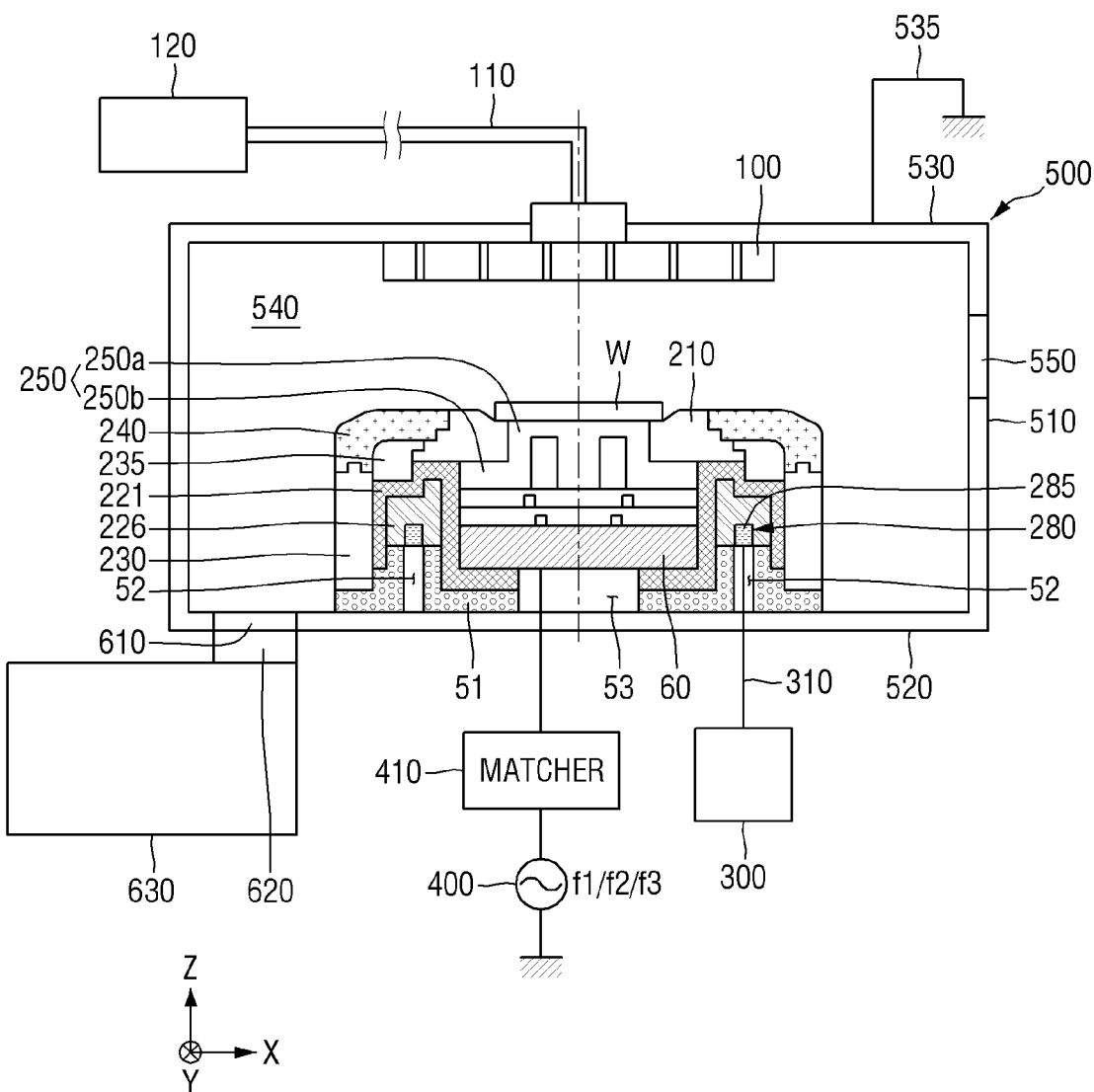
FIG. 24 is a schematic diagram of another example of plasma processing equipment according to the present inventive concepts.

Referring to FIG. 24, the plasma processing equipment of this example includes a cooling unit 280 having a cooling line extending in the edge electrode 226. The cooling line of cooling unit 280 may contain a refrigerant 285. The passageway in the edge electrode 226 defined by cooling line of the cooling unit 280 may be a circular channel.

The refrigerant 285 may directly receive heat generated in the edge electrode 226 to lower the temperature of the edge electrode 226. Thus, the cooling unit 280 can perform an effective temperature control of the edge electrode 226 and the dielectric ring 221.

Hereinafter, another example of plasma processing equipment according to the present inventive concepts will be described with reference to FIG. 25. The corresponding parts of the above description will be simplified or omitted.

Figure 25:
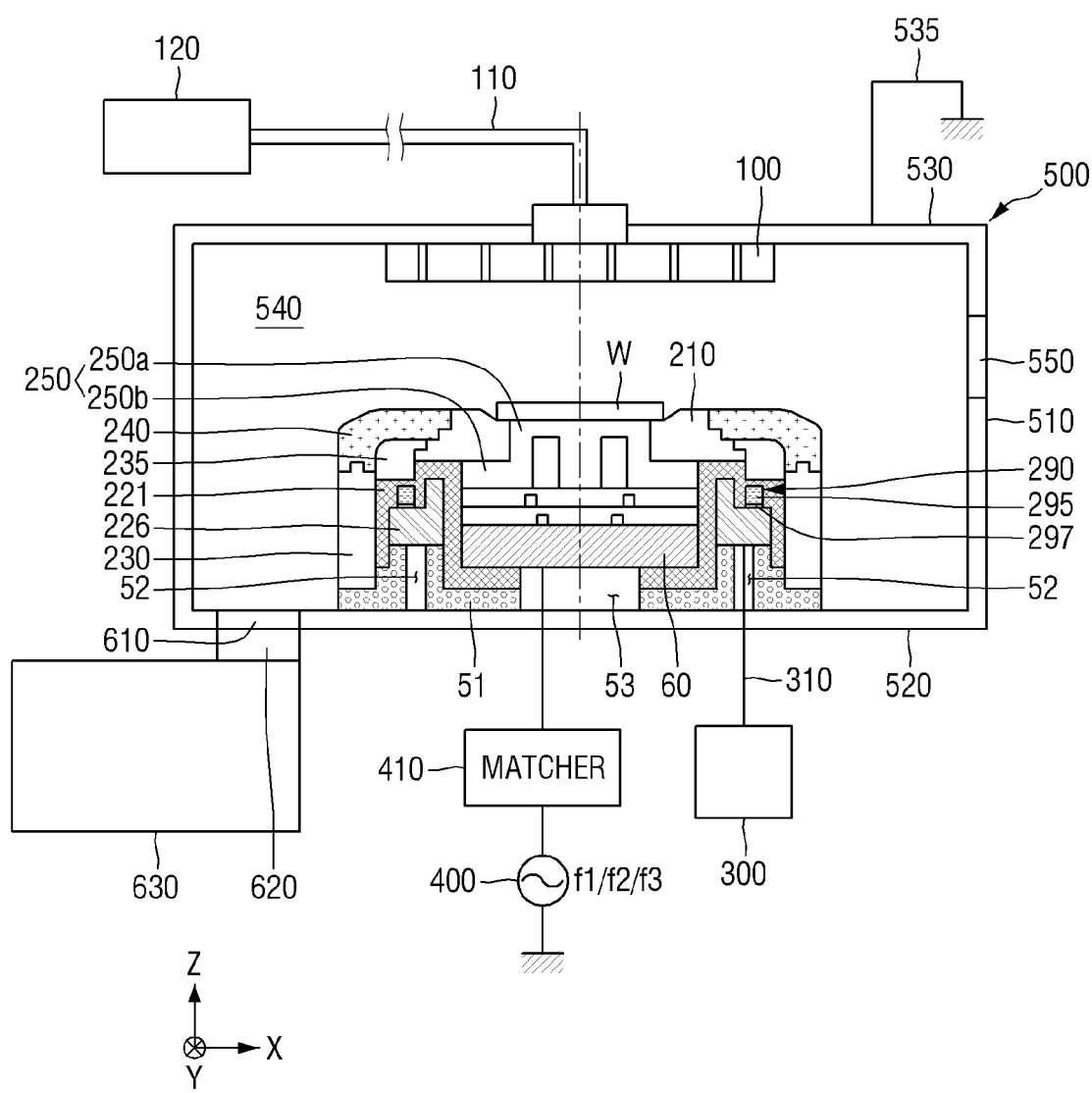
FIG. 25 is a schematic diagram of yet another example of plasma processing equipment according to the present inventive concepts.

Referring to FIG. 25, the plasma processing equipment of this example includes a cooling unit 290 and an insulating film 297.

The heat transfer mechanism of the cooling unit 290 is located on the edge electrode 226. That is, the cooling unit 290 includes a cooling line extending in the dielectric ring 221. The cooling line of the cooling unit 290 may contain a refrigerant 295. The passageway defined inside the dielectric ring 221 by the cooling line of the cooling unit 290 may be a circular channel.

The insulating film 297 may be disposed under the cooling passageway of the cooling unit 290. The insulating film 297 may insulate the edge electrode 226 from the cooling unit 290. In particular, in this example the refrigerant 295 of the cooling unit 290 does not contact the edge electrode 226.

The refrigerant 295 may directly receive the heat of the dielectric ring 221 to lower the temperature of the edge electrode 226 and the dielectric ring 221. Accordingly, the cooling unit 290 can perform the effective temperature control of the edge electrode 226 and the dielectric ring 221.

In concluding the detailed description, those skilled in the art will appreciate that many variations and modifications can be made to the examples disclosed herein without substantially departing from the principles of the present inventive concepts. Therefore, the disclosed examples are used in a generic and descriptive sense only and not for purposes of limitation.

What is claimed is:

1. Plasma processing equipment comprising:
a chuck stage including an upper part having a first radius and a lower part having a second radius greater than the first radius, an upper surface of the upper part of the chuck stage dedicated to support a substrate thereon, and the chuck stage including a lower electrode;
an upper electrode disposed over the chuck stage;
an AC power supply operatively connected to the upper electrode or the lower electrode, and configured to selectively produce a first signal of a first frequency and a second signal of a second frequency to form a plasma between the upper electrode and lower electrode, and to selectively produce a third signal of a third frequency during a plasma process after the plasma is formed between the upper electrode and the lower electrode, wherein the first, second and third frequencies are different from each other and the third frequency is lower than the first and second frequencies;
a first edge ring extending around a side surface of the upper part of the chuck stage;
a second edge ring extending around a side surface of the first edge ring;
a dielectric ring extending around a side surface of the lower part of the chuck stage, the dielectric ring having a lateral dielectric ring section in contact with the side surface of the lower part of the chuck stage, and a lower dielectric ring section in contact with a lower surface of the lower part of the chuck stage;
a thermal pad between the dielectric ring and the first edge ring, and between the dielectric ring and the second edge ring, the thermal pad being in contact with lower parts of the first edge ring and the second edge ring;
a thermally conductive electrode between the chuck stage and the lower dielectric ring section, the thermally conductive electrode being in contact with the lower surface of the chuck stage;
an edge electrode disposed within the dielectric ring, wherein the dielectric ring covers a top surface and radially inner and outer peripheral surfaces of the edge electrode, and a bottom surface of the edge electrode is uncovered by the dielectric ring and electrically coupled to the chuck stage; and
a resonance circuit connected to the edge electrode and configured to resonate when the third signal is produced and configured not to resonate when the first and second signals are produced,
wherein the resonance circuit comprises
a pass filter circuit having an input connected to the edge electrode and configured to pass only the third signal among the first, second and third signals to an output of the pass filter circuit, and
a series resonance circuit connected in series with the output of the pass filter circuit and having a coil and a grounded variable capacitor connected in series to the coil.

2. The plasma processing equipment of claim 1, wherein the pass filter circuit comprises a first parallel resonance circuit including a first coil and a first capacitor connected in parallel to each other.

3. The plasma processing equipment of claim 2, wherein the pass filter circuit comprises a second parallel resonance circuit including a second coil and a second capacitor connected in parallel to each other, and
the first and second parallel resonance circuits are connected in series to each other.

4. The plasma processing equipment of claim 1, wherein the third frequency of the third signal is lower than the first and second frequencies of the first and second signals.

5. Plasma processing equipment comprising;
a process chamber;
a chuck stage disposed inside the process chamber, the substrate support including an upper part having a first radius and a lower part having a second radius greater than the first radius, an upper surface of the upper part of the chuck stage dedicated to support a substrate thereon;
a lower electrode integral with the chuck stage;
an upper electrode disposed in an upper part of the process chamber above the upper surface of the chuck stage and constituting a plasma source with the lower electrode;
an AC power supply connected to one of said lower and upper electrodes and configured to generate signals at a plurality of different frequencies, the plurality of different frequencies including at least one frequency to form a plasma between the upper and lower electrodes, and at least another frequency generated during a plasma process after the plasma is formed between the upper and lower electrodes;
an edge ring structure circumjacent the upper surface of the chuck stage, the edge ring structure including a first edge ring extending around a side surface of the upper part of the chuck stage, and a second edge ring extending around a side surface of the first edge ring;
a dielectric ring on which the edge ring structure is disposed, the dielectric ring having a lateral dielectric ring section in contact with a side surface of the lower part of the chuck stage, and a lower dielectric ring section in contact with a lower surface of the lower part of the chuck stage;
a thermal pad between the dielectric ring and the first edge ring and between the dielectric ring and the second edge ring, the thermal pad being in contact with lower parts of the first edge ring and the second edge ring;
a thermally conductive electrode between the chuck stage and the lower dielectric ring section, the thermally conductive electrode being in contact with the lower surface of the chuck stage;
an edge electrode disposed within the dielectric ring with the dielectric ring interposed between the edge electrode and the edge ring structure, wherein the dielectric ring surrounds the edge electrode except for a bottom surface of the edge electrode which is electrically coupled to the chuck stage; and
a resonance circuit disposed outside the process chamber and electrically connected to the edge electrode, the resonance circuit configured to resonate when the at least another frequency is generated during the plasma process and configured not to resonate when the at least one frequency to form the plasma is generated,
wherein the resonance circuit comprises
a pass filter circuit having an input connected to the edge electrode and configured to pass only the at least another frequency generated during the plasma process from among the plurality of different frequencies to an output of the pass filter circuit, and
a series resonance circuit connected in series with the output of the pass filter circuit, the series resonance circuit having a coil and a grounded variable capacitor connected in series with the coil.

6. The plasma processing equipment of claim 5, wherein the AC power supply is configured to supply first, second and third power signals at a first frequency, a second frequency and a third frequency, respectively,
the first frequency, the second frequency and the third frequency being different from each other.

7. The plasma processing equipment of claim 6, further comprising a matcher connecting the AC power supply to said one of the lower electrode and the upper electrode.

8. The plasma processing equipment of claim 6, wherein the pass filter circuit allows only the third power signal from among the first, second and third power signals to pass, and
the third frequency is lower than each of the first frequency and the second frequency.

9. The plasma processing equipment of claim 5, further comprising:
a controller operatively connected to the grounded variable capacitor and operable to adjust capacitance of the grounded variable capacitor.

10. The plasma processing equipment of claim 5, wherein the thermal pad has a first part in contact with the first edge ring, and a second part in contact with the second edge ring.

11. The plasma processing equipment of claim 10, wherein a thermal resistance of the first part is different from a thermal resistance of the second part.

12. The plasma processing equipment of claim 10, wherein a width of the first part in a radial direction of the edge ring structure is different from a width of the second part in the radial direction.

13. The plasma processing equipment of claim 10, wherein a thickness of the first part is different from a thickness of the second part.

14. The plasma processing equipment of claim 5, wherein the first edge ring and the second edge ring each comprise at least one material selected from a group consisting of Si, SiC, $SiO_2$, AlN, $Al_2O_3$ and $ZrO_2$.

15. Plasma processing equipment comprising:
a chuck stage including an upper part having a first radius and a lower part having a second radius greater than the first radius, an upper surface of the upper part of the chuck stage dedicated to support a substrate thereon, and the chuck stage including a lower electrode;
a gas feeder that supplies gas toward the chuck stage, the gas feeder including an upper electrode disposed above the upper surface of the chuck stage and constituting a plasma source with the lower electrode;
an AC power supply operatively connected to the upper electrode or the lower electrode, and configured to selectively produce a first signal of a first frequency and a second signal of a second frequency to form a plasma between the upper electrode and the lower electrode, and to selectively produce a third signal of a third frequency during a plasma process after the plasma is formed between the upper electrode and the lower electrode, wherein the first, second and third frequencies are different from each other and the third frequency is lower than the first and second frequencies;
a dielectric ring extending around a side surface of the lower part of the chuck stage, the dielectric ring having a lateral dielectric ring section in contact with the side surface of the lower part of the chuck stage, and a lower dielectric ring section in contact with a lower surface of the lower part of the chuck stage;
an edge ring structure disposed on the dielectric ring, the edge ring structure including a first edge ring extending around a side surface of the upper part of the chuck stage, and a second edge ring extending around a side surface of the first edge ring;
a thermal pad between the dielectric ring and the first edge ring, and between the dielectric ring and the second edge ring, the thermal pad being in contact with lower parts of the first edge ring and the second edge ring;
a thermally conductive electrode between the chuck stage and the lower dielectric ring section, the thermally conductive electrode being in contact with the lower surface of the chuck stage;
an edge electrode within the dielectric ring and including a lower surface that is electrically coupled to the chuck stage; and
a resonance circuit electrically connected to the edge electrode and configured to resonate when the third signal is produced and configured not to resonate when the first and second signals are produced,
wherein the resonance circuit comprises
a pass filter circuit having an input connected to the edge electrode and configured to pass only the third signal from among the first, second and third signals to an output of the pass filter circuit, and
a series resonance circuit connected in series with the output of the pass filter circuit, the series resonance circuit having a first coil and a grounded first variable capacitor connected in series with the first coil.

16. The plasma processing equipment of claim 15, wherein the edge electrode is located inside the lateral dielectric ring section.

* * * * *